United States Patent
Tanaka et al.

(10) Patent No.: US 6,645,856 B2
(45) Date of Patent: Nov. 11, 2003

(54) METHOD FOR MANUFACTURING A SEMICONDUCTOR DEVICE USING HALF-TONE PHASE-SHIFT MASK TO TRANSFER A PATTERN ONTO A SUBSTRATE

(75) Inventors: Toshihiko Tanaka, Tokyo (JP); Norio Hasegawa, Hinode (JP); Tsuneo Terasawa, Ome (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/170,647

(22) Filed: Jun. 14, 2002

(65) Prior Publication Data

US 2003/0036293 A1 Feb. 20, 2003

(30) Foreign Application Priority Data

Aug. 17, 2001 (JP) ........................................ 2001-247868

(51) Int. Cl.⁷ ............................................ H01L 21/32
(52) U.S. Cl. .......................... 438/671; 438/946; 430/5; 430/313
(58) Field of Search ........................... 430/5, 313, 317, 430/318, 319; 438/637, 671, 780, 944, 946

(56) References Cited

U.S. PATENT DOCUMENTS

| | | | | |
|---|---|---|---|---|
| 5,300,378 A | * | 4/1994 | Minami | 430/5 |
| 5,510,230 A | * | 4/1996 | Tennant et al. | 430/325 |
| 5,582,938 A | * | 12/1996 | Ham | 430/5 |
| 5,604,060 A | * | 2/1997 | Miyashita et al. | 430/5 |
| 5,821,015 A | * | 10/1998 | Sugawara | 430/5 |
| 5,879,839 A | * | 3/1999 | Jung et al. | 430/5 |
| 5,902,717 A | * | 5/1999 | Hayakawa | 430/312 |
| 6,174,631 B1 | * | 1/2001 | French et al. | 430/5 |
| 6,458,496 B2 | * | 10/2002 | Motonaga et al. | 430/5 |
| 2002/0034694 A1 | * | 3/2002 | Tanaka et al. | 430/5 |
| 2002/0061452 A1 | * | 5/2002 | Nozawa et al. | 430/5 |

FOREIGN PATENT DOCUMENTS

JP        9-211837        1/1996

* cited by examiner

Primary Examiner—Carl Whitehead, Jr.
Assistant Examiner—Stephen W. Smoot

(57) ABSTRACT

A pattern is transferred to a resist film on a wafer by a reduction projection exposure method using a half-tone phase-shift mask in which is formed a half-tone phase-shifter pattern including a thin-film pattern functioning as an attenuator and a resist pattern functioning as the photosensitive composition for phase adjustment. This method improves the accuracy of dimensions of the pattern transferred to the wafer.

17 Claims, 18 Drawing Sheets

FIG. 18

| MENU | EXCLUSIVE USE OF HYBRID MASK | USE OF HYBRID MASK FOR INITIAL PRODUCTION | USE OF HYBRID MASK FOR DEVELOPMENT | EXCLUSIVE USE OF CONVENTIONAL HALFTONE MASK |
|---|---|---|---|---|
| HALFTONE MASK TYPE | PRODUCTION OF ONLY HYBRID MASK THROUGHOUT THIS FLOW | SMALL-QUANTITY PRODUCTION OF HYBRID MASK, FOLLOWED BY MASS PRODUCTION OF CONVENTIONAL HALFTONE MASK | ONLY DEVELOPMENT OF HYBRID MASK, FOLLOWED BY PRODUCTION OF CONVENTIONAL HALFTONE MASK | PRODUCTION OF ONLY CONVENTIONAL HALFTONE MASK FROM THE BEGINNING |
| PRODUCTION AMOUNT | SMALL | SMALL→LARGE | LARGE | LARGE |
| DEVELOPMENT COST (FOR MASK) | SMALL | SMALL→LARGE | LARGE | MEDIUM~LARGE |
| DEVELOPMENT TAT | SHORT | SHORT | SHORT | LONG |
| POSSIBILITY OF PATTERN CHANGE | NOT ASKED | NOT ASKED | NOT ASKED | SMALL LARGE DEVELOPMENT COST IS NECESSARY UPON PATTERN CHANGE |

METHOD FOR MANUFACTURING A SEMICONDUCTOR DEVICE USING HALF-TONE PHASE-SHIFT MASK TO TRANSFER A PATTERN ONTO A SUBSTRATE

CLAIM OF PRIORITY

This application claims priority to Japanese Patent Application No. 2001-247868 filed on Aug. 17, 2001.

BACKGROUND OF THE INVENTION

1. Field of the Invention

The present invention relates to a technology for manufacturing semiconductor devices and, more particularly, to a technology applicable to exposure methods in the production of semiconductor devices.

2. Description of the Background

Exposure may be used to form a prescribed pattern on a semiconductor device using a phase-shift mask of half-tone type. The phase-shift mask of half-tone type ("half-tone phase-shift mask") is a mask which has on a transparent mask base a film that is semitransparent to exposure light (this film is referred to as a "half-tone film". This half-tone film causes exposure light passing through it to undergo phase shifting without affecting exposure light not passing through it. The half-tone film is usually made of an inorganic material and is relatively thick (e.g., 100 nm)

An exemplary description of a phase-shift mask of half-tone type is found in Japanese Patent Laid-open No. 211837/1997. The disclosed phase-shift mask is constructed to prevent an anomalous pattern due to subpeak from occurring in the shaded part.

The conventional phase-shift mask of half-tone type made of an inorganic film has at least the following limitations. A first limitation is a low fabricating precision due to the thickness of the half-tone film. A second limitation is a low dimensional accuracy of patterns transferred onto the wafer resulting from MEF (Mask Error Enhance Factor) involved in pattern miniaturization. A third limitation is a hindrance to the reduction of TAT (Turn Around Time) in the production of semiconductor devices which arises as it is necessary to produce a number of photomasks before acceptable ones are obtained because the phase-shift mask of half-tone type has a poor fabrication precision.

SUMMARY OF THE INVENTION

The present invention provides a technology which improves the dimensional accuracy of patterns transferred onto the wafer and which reduces TAT in the production of semiconductor devices.

Other and further objects, features, and advantages of the invention will be apparent from the following description taken in connection with the accompanying drawings. In summary, the invention disclosed herein is concerned with transferring a pattern onto a resist film on a wafer by reduction projection exposure through a photomask in which is formed a half-tone phase-shift pattern having an attenuating film and an organic film for phase adjustment.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 18 is a diagram illustrating the use of the photomask in the production of a semiconductor device according to the present invention.

DETAILED DESCRIPTION OF THE INVENTION

Figure 1:
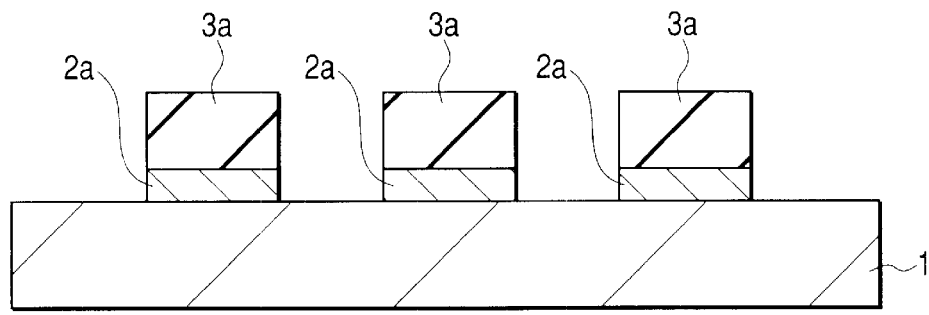
FIG. 1 is a sectional view showing important parts of a photomask used in the production of a semiconductor device in a first example of the present invention.

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

Several terms used in this specification are defined as follows:

1. A "photomask" comprises a substrate and a pattern formed thereon, said pattern shading light or changing the phase of light. The term "on the substrate" implies the top surface of the substrate and the region in the inside or outside proximity of the top surface of the substrate (e.g., the pattern may be arranged on another substrate placed near the top surface of the substrate). Ordinary photomasks may include not only a Cr mask (in which the shade is a film of metal such as Cr) but also an ordinary half-tone phase-shift mask (in which the half-tone mask is an inorganic film) and the so-called "Levenson phase shift mask" (in which phase shifters to reverse the phase of transmitted light are alternately arranged at the opening). These photomasks are simply referred to as "masks" herein.
2. The "rise time for the production of a semiconductor device" refers to the preliminary stages of development, trial production, and evaluation, which precede mass production of the device.

The embodiments of the present invention which are explained in the following description are related to one another (unless otherwise mentioned) even though they are explained in separate sections or examples. One example may be a modification of another example or one example may serve to complement the description of another example.

In the examples mentioned below, the number of elements (including the value, amount, range, etc. which elements possess) is not restricted to a specified number, unless explicitly mentioned or except for the case in which it is restricted to a specific one in principle. The number may be larger or smaller than the specified number.

Moreover, in the examples mentioned below, the constituent elements (including elemental steps) are not necessarily essential unless explicitly mentioned or except for the case in which they are essential in principle. The claims themselves are the measure of what parts are essential for each different claimed invention or embodiment.

Likewise, in the examples mentioned below, the configurations and relative positions of constituent elements include those that are substantially similar to those provided unless explicitly mentioned or except for the case in which they are unique in principle. The same is true of the values and ranges mentioned above.

In the figures illustrating examples, those elements having the same function are given the same reference numbers, and their explanation is not repeated. Those figures illustrating examples may include cross-hatching to facilitate understanding even though they are plan views. Further, in the examples mentioned below, MIS stands for MIS•FET (Metal Insulator Semiconductor Field Effect Transistor), pMIS stands for p-channel MIS•FET, and nMIS stands for n-channel MIS•FET. Examples of the present invention are explained in detail with reference to the accompanying drawings.

EXAMPLE 1

First Exemplary Mask Production Method

This example demonstrates a half-tone phase-shift mask with the sectional structure (for important parts) shown in FIG. 1. There are shown a glass substrate (or mask substrate) 1 which is a transparent substrate, a thin film pattern (or attenuating thin film pattern or attenuating film) 2a which attenuates exposure light, and a resist pattern (or photosensitive organic film or photosensitive composition film) 3a. The half-tone phase-shift mask includes a half-tone film which is a laminate film comprised of a thin-film pattern 2a and a photosensitive organic film pattern 3a formed thereon. The glass substrate 1 is not necessarily restricted to glass; it may be any substrate of crystalline $SiO_2$ or $CaF_2$ which is transparent to the exposure light used for pattern projection. The side of the glass substrate 1 on which the half-tone film is formed is designated herein-as the first principal plane, and the opposite side is designated as the second principal plane.

The half-tone phase-shift mask is prepared by the following process explained with reference to FIG. 2. The first step shown in FIG. 2(a) starts with coating a glass substrate (blank) 1 of quartz glass or the like with an attenuating thin film 2. On the attenuating thin film 2 is formed a resist film 3. The resist film 3 is patterned with electron beams (EB). In this example, the attenuating thin film 2 is formed from chrome (Cr). However, it may be a thin film of $ZrSi_xO_y$, SiON, SiN, $CrF_x$, $MoSi_x$, $CrO_xF_y$, W, Ta, Ti, TiN, $WN_x$, or the like. Any metal-containing thin film is desirable because of its strong action to attenuate exposure light and its high resistance to exposure light. The Cr film preferably has a thickness of 20 nm, for example. It is desirable to make the attenuating thin film 2 hydrophobic with hexamethyldisilazane or the like before the resist film 3 is formed on the attenuating thin film 2. This step is intended to reduce the amount of side etching at the time of subsequent wet etching, to improve fabrication precision, and to reduce dimensional variation.

The resist film 3 preferably has a thickness of about 122 nm. It may be formed from a chemically amplified electron beam resist such as that with polyhydroxystyrene resin. It may also be formed from a non-chemically amplified resist with naphthoquinonediazide or a PMMA resist. The resist may be of positive type or negative type. Also, the resist may be one which is sensitive to a laser beam with a wavelength of 365 nm. The resist should not be incorporated with a light absorbing agent from the standpoint of light resistance except for phenolic resin or novolac resin which has a light-absorbing radical (for a wavelength of 193 nm) fixed to the polymer backbone. Any light-absorbing agent added to the resin is subject to chemical reaction which changes absorbance, refractive index, and film thickness.

The resist may be replaced by any photosensitive composition such as SOG (spin on glass) incorporated with an acid-generating agent. SOG obtains favorable light resistance by cure baking. It is advantageous in that it is not subject to substantial change with time. Any resist which does not appreciably decrease in thickness at the time of development is desirable because it permits easy phase shift control. An example of such a resist is an acrylic-based resist or HAER (High Activation Energy Type Resist).

Figure 2A:
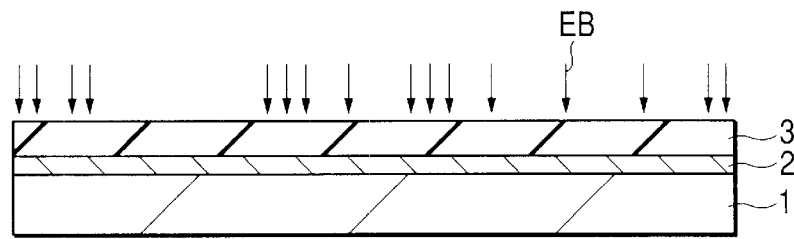
FIGS. 2(a) to 2(d) are sectional views showing the steps for producing the photomask shown in FIG. 1.
Figure 2B:
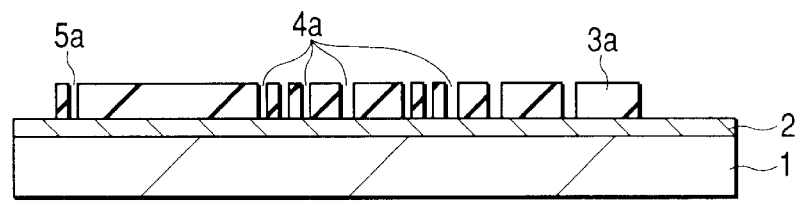

Subsequently, development is carried out to form a resist pattern 3a (including circuit patterns 4a and a reticle aligning mark pattern 5a) as shown in FIG. 2(b). Thereafter, the resist undergoes cure baking at 110° C. This baking permits subsequent etching to be performed in a stable manner.

Figure 2C:
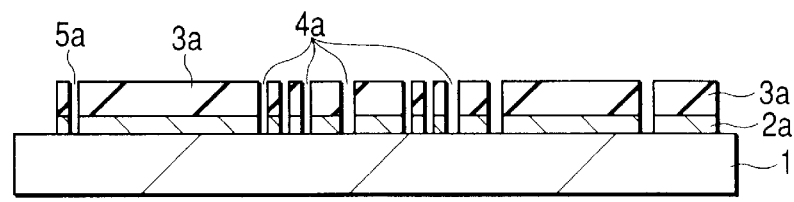

In the subsequent step, etching is performed on the chrome film (attenuator) so as to form a thin film pattern 2a of attenuator, as shown in FIG. 2(c). This etching may be either dry etching or wet etching. In this case, wet etching with an aqueous solution of diammonium cerium (IV) nitrate is performed. The advantage of wet etching is a decreased instance of particle defects and high dimensional accuracy due to uniform etching. Another advantage is easy phase control due to the substantial absence of etching on the resist. The film being etched is thin (about 20 nm) and suffers only a small degree of side etching. On the other hand, dry etching offers the advantage of not causing pinhole defects.

Figure 2D:
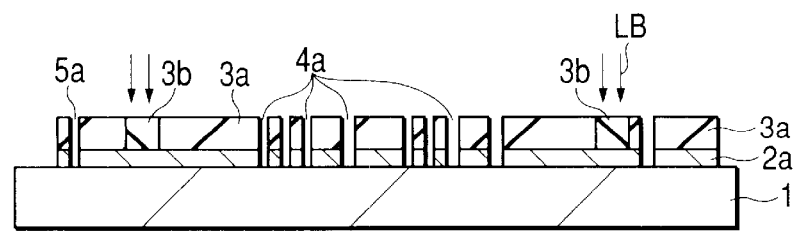

In the subsequent step, a shade band is formed by exposure to an infrared laser, as shown in FIG. 2(d). The shade band prevents overlapping from occurring in sequential shots of exposure. The resist in which the shade band 3b is to be formed is irradiated with infrared laser beams so that the resist darkens (becomes black) for better shading. The shade band 3b takes on a shape of a flat frame outside the circuit pattern region. It has a lower transmission (for exposure light) than the half-tone film placed thereon. If it were not for the shade band 3b, the half-tone film will transmit about 4–15% of exposure light, thereby causing overlapped exposure in the peripheral region after repeated exposure steps (which leads to a defective pattern). This problem is avoided by the shade band 3b.

Finally, baking is performed to complete the half-tone phase-shift mask. This baking is not essential; however, it improves resistance to exposure light or resistance to change time. Baking with irradiation with DUV rays (about 250 nm) effectively cures the resist without changing the shape of the resist.

The mask prepared in this example produces a phase difference of $\pi$ at the opening of the half-tone pattern film (which is a laminate film comprised of a chrome film and a resist film) for a KrF excimer laser light with a wavelength of 248 The half-tone film (or the laminate film) has a transmission of about 6%; however, this value is not limiting. A half-tone film comprised of a 17-nm thick chrome film and a 125-nm thick resist film would have a transmission of 9%, and the resulting half-tone phase-shift mask would have a phase difference of $\pi$. The attenuating thin film 2 (or thin film pattern 2a) should be made thin or thick according to the transmission characteristics required. On the other hand, the phase difference may be adjusted by changing the thickness of the resist film (or the resist pattern 3a). In this way it is possible to obtain a half-tone phase-shift mask having desired optical properties.

Figure 3:
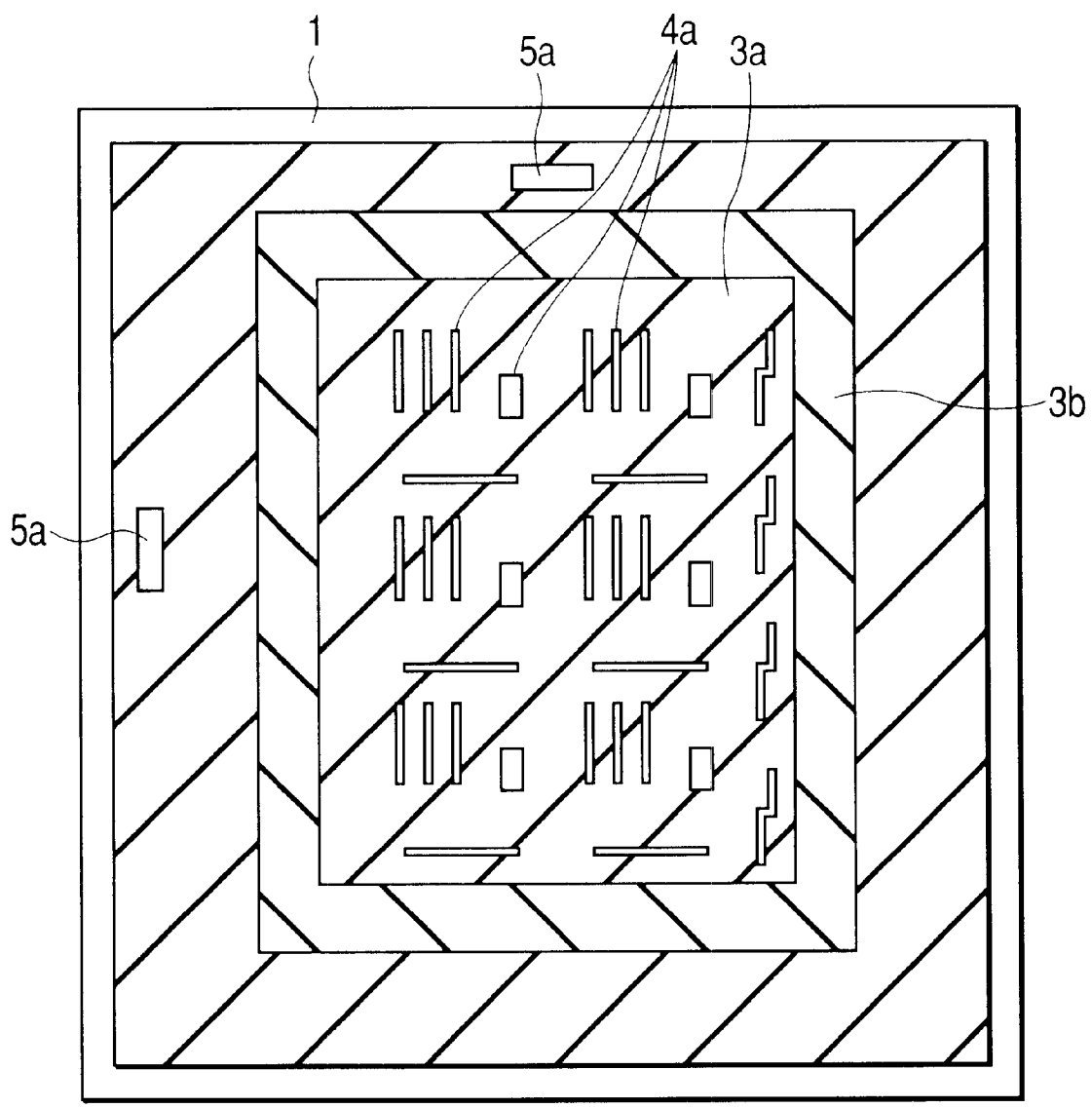
FIG. 3 is a plan view of the photomask shown in FIG. 1.

FIG. 3 is a plan view showing the half-tone phase-shift mask prepared by the method mentioned in this example. There are shown a circuit pattern 4a, a shade band 3b, and a reticle aligning mark pattern 5a, which are formed on a glass substrate 1. In this case, the reticle aligning mark pattern 5a is formed outside the shade band 3b. This position varies from one exposure system to another. There may be an instance where it is arranged within the region of the shade band 3b. That is, the mark pattern 5a may be formed by opening a part of the shade band 3b.

In this example, the thickness of the attenuating thin film 2 is about one-fifth that of the etched film (half-tone film) of the ordinary half-tone phase-shift mask. This makes it possible to greatly reduce the amount of side etching when the attenuating thin film 2 is etched. As the result, the half-tone phase-shift mask prepared in this example has a pattern dimensional accuracy as high as 9 nm, whereas that of the conventional half-tone phase-shift mask is about 15 nm.

Second Exemplary Mask Production Method

This example demonstrates the same half-tone phase-shift mask as in Example 1 except that the resist film has a thickness of 383 nm and the half-tone pattern has a phase difference of $3\pi$. The thicker resist film 3 prevents pinhole defects which would otherwise occur during wet etching. Thus, the resulting half-tone phase-shift mask has a decreased defect density. Inevitable pinhole defects can be corrected by carbon coating (which is employed for the ordinary half-tone phase-shift mask). In addition, black-type defects due to particles can be corrected by the FIB method (focused ion beam). Defect inspection may be performed in the same way as used for the ordinary phase-shift mask.

Third Exemplary Mask Production Method

This example demonstrates a half-tone phase-shift mask with a shade band of water-soluble negative resist and a pellicle. The steps of production are explained in the following description with reference to FIGS. 4(a) to 4(f).

Figure 4A:
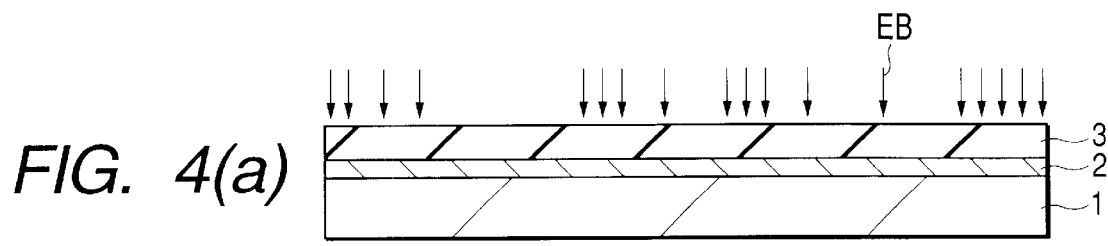
FIGS. 4(a) to 4(f) are sectional views showing the steps of producing another photomask used in the production of a semiconductor device according to the present invention.

The first step, shown in FIG. 4(a), is to cover a glass substrate (blank) 1 of quartz glass or the like sequentially with an attenuator thin film 2 and a resist film 3. After ordinary baking, the resist film 3 is patterned using electron beams. In this example, the attenuating thin film 2 is formed from chrome; however, it may also be formed from other materials such as those explained above with reference to FIG. 2(a). The attenuating thin film 2 is preferably about 22 nm thick.

The resist film, which is formed from PMMA, is preferably about 155 nm thick. The half-tone film with this film thickness produces a phase difference of $\pi$ for light with a wavelength of 193 nm and has a transmission of 6%. If a resist film for a phase difference of $3\pi$ is to be made by pinhole-free wet etching (mentioned above), it should have a thickness of about 467 nm.

Figure 4B:
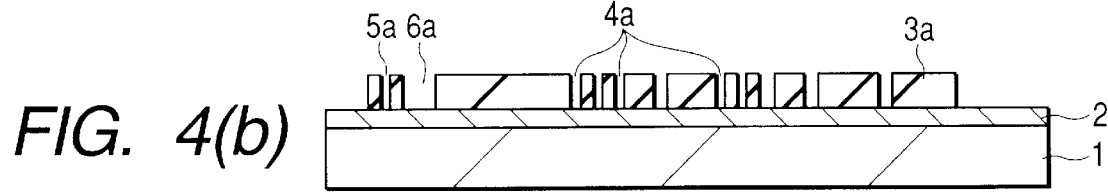
Figure 4C:
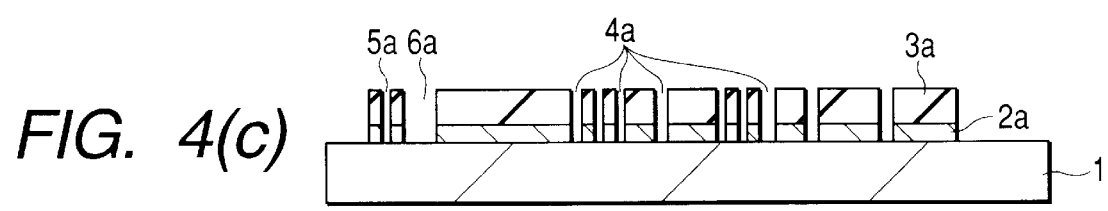

In the second step, development is carried out to form a resist pattern 3a, which includes circuit patterns 4a and a reticle aligning mark pattern 5a, as shown in FIG. 4(b). An opening 6a in the resist pattern 3a corresponds to the place where the pellicle frame is placed in a later step. In the third step, etching is performed on the attenuating thin film (or chrome film) to form the thin film pattern 2a. This etching is wet etching, although dry etching is also acceptable.

Figure 4D:
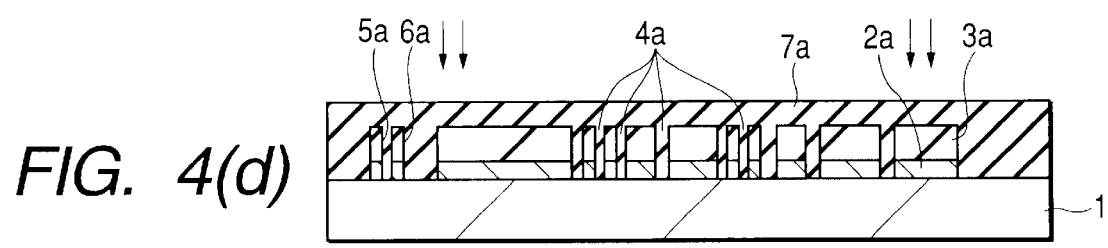
Figure 4E:
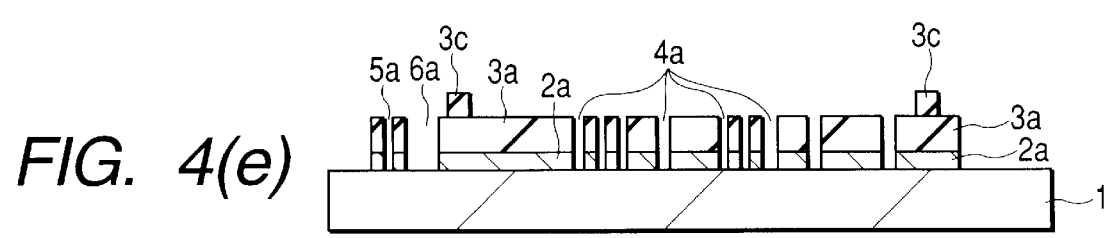

In the fourth step, the entire surface is coated with a water-soluble negative resist 7a, as shown in FIG. 4(d). Those parts where shade bands are to be formed are exposed. In the fifth step, development is performed to form shade bands 3c (in the shape of a flat frame), as shown in FIG. 4(e). An exemplary water-soluble negative resist used herein is prepared in the following manner. In 180 g of deionized water, 6.26 g of acrylamide and 6.34 g of diacetone acrylamide are dissolved. The resulting solution is placed in a 200-mL separable flask and heated to 57° C. on a water bath. To the heated solution, an aqueous solution containing 0.02 g of 2,2'-azobis(2-(imidazolin-2-yl)propane)dihydrochloride as an initiator for free-radical polymerization is added. Polymerization is continued for 5 hours. The obtained copolymer has a molecular weight of 1,400,000.

To 9.40 g of the copolymer (as 7% solution), 0.066 g of sodium 4-azidocinnamaldehyde-2-sulfonate, 1.90 g of deionized water, and 3.6 g of 1% aqueous solution of sodium hydroxide are added. After reaction for 2 days, the reaction product is neutralized with acetic acid and then diluted with deionized water so that the solid content becomes 1.5%. To this solution, ethylene glycol (100% based on the solid content) and silane coupling agent (0.01% based on the solid content) are added. Thus, there is obtained the resist solution.

The advantage of the negative resist is that the exposed part is limited to a small area where the shade band is formed, and the remaining large portion is automatically removed during development. The exposure light used in this example is a laser beam having a wavelength of 365 nm; however, an electron beam is also acceptable. The water-soluble resist has no effect at all on the pattern of PMMA.

Figure 4F:
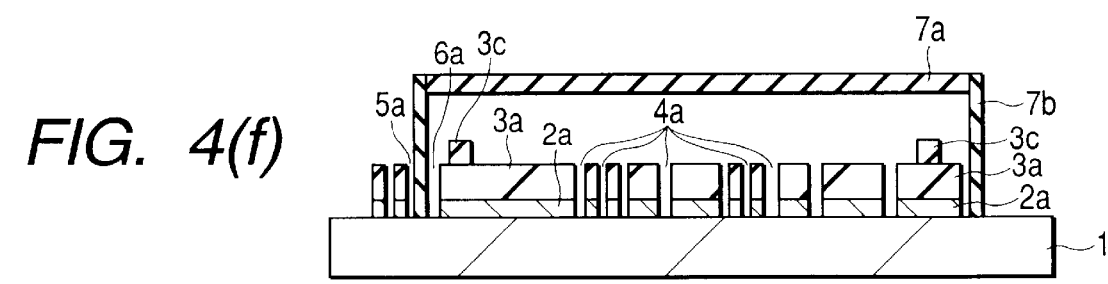

Finally, a pellicle frame 7b (as shown in FIG. 4(f)), which has a pellicle film 7a, is attached to the glass substrate 1. Thus there is obtained the half-tone phase-shift mask for an ArF excimer laser having a wavelength of 193 nm. Because the opening 6a has been formed in the previous step, the base of the pellicle frame 7b fits directly to the glass substrate 1. Thus, the pellicle frame 7b remains in position. If a resist film is present in the position where the pellicle frame 7b is placed, the resist film will peel off, giving rise to foreign matter, when the pellicle frame 7b is attached or removed. In this example, these potential disadvantages are avoided because the pellicle frame 7b is attached directly to the glass substrate 1.

Figure 5A:
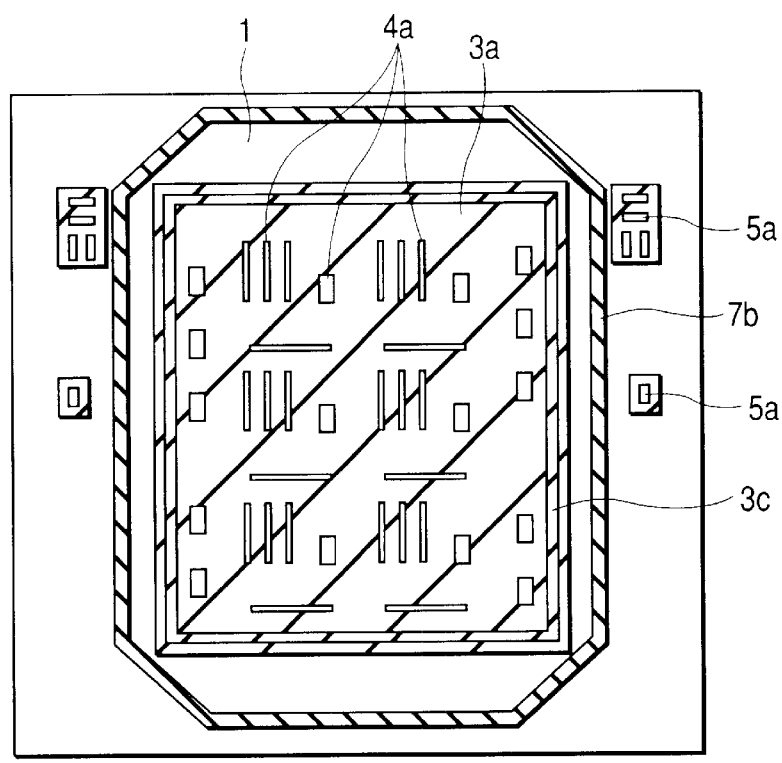
FIG. 5(a) is a plan view of the photomask shown in FIG. 4.

FIG. 5(a) is a plan view showing the half-tone phase-shift mask prepared in this example. On the glass substrate 1 are formed circuit patterns 4a, the shade band 3c, the reticle aligning mark pattern 5a, and the pellicle frame 7b. In this case, the reticle aligning mark pattern 5a is formed outside the pellicle frame 7b; however, this position varies from one exposure system to another. There may be an instance where the reticle aligning mark pattern 5a is placed inside the pellicle frame 7b.

Figure 5B:
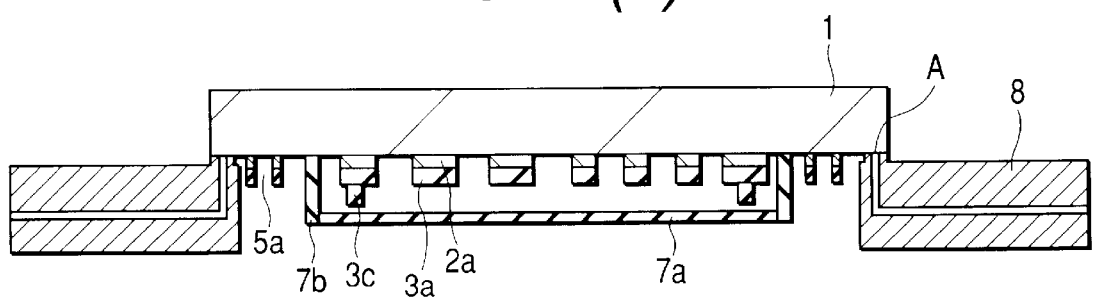
FIG. 5(b) illustrates how the photomask is mounted on an exposure system.

FIG. 5(b) is a sectional view showing the half-tone phase-shift mask placed on a stage 8 of an exposure system. The half-tone film (or the attenuating thin film 2 comprised of a resist film 3 and a chrome film) does not remain on the place A which comes into contact with the stage 8 of the exposure system. This arrangement prevents the resist film from peeling off by contact to give foreign matter.

The mask produced by this third exemplary mask production method achieves a very high pattern dimensional accuracy (9 nm) as in the case of the mask produced by the second exemplary mask production method mentioned above.

Fourth Exemplary Mask Production Method

This method employs a photosensitive SOG and an ordinary negative resist in place of the PMMA resist and the water-soluble negative resist used in the third mask production method described above. The photosensitive SOG is preferably comprised of silanol and an acid generating agent (5%), and the water-soluble negative resist is a phenolic resin of chemically amplified type. The shade band is exposed to electron beams. The development of the photosensitive SOG is followed by cure baking at 250° C. to harden and insolubilize the SOG pattern for the phenolic-based chemically amplified negative resist.

The mask produced by this fourth exemplary mask production method achieves a very high pattern dimensional accuracy (9 nm) as in the case of the masks produced by the first and third mask production methods described above.

Fifth Exemplary Mask Production Method

This method includes a step of forming the shade band in a fin pattern. The steps for forming the half-tone phase-shift mask are explained with reference to FIGS. 6(a) to 6(d).

Figure 6A:
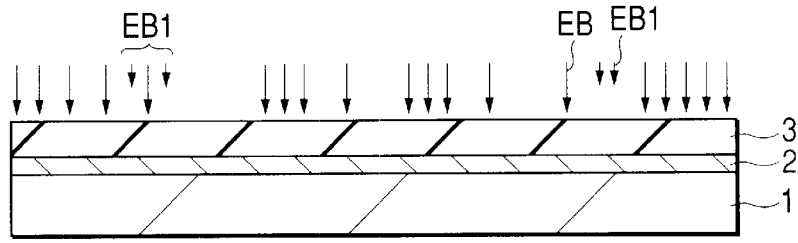
FIGS. 6(a) to 6(d) are sectional views showing the steps for producing another photomask used in the production of a semiconductor device according to the present invention.

In the first step shown in FIG. 6(a), a glass substrate 1 (blank) of quartz glass is covered with an attenuating thin film 2 and a resist film 3. After baking, the resist film 3 is patterned by electron beams (EB). In this step, a fine pattern (as shown in FIG. 8 and explained below) is formed by electron beams (EB1) in the area where the shade band is to be formed. In this method, the attenuating thin film 2 is formed from chrome; however, it may also be formed from any other material explained with reference to FIGS. 2(a) and 4(a). The attenuating thin film 2 is about 20.6 nm thick, and the resist film 3 is about 383 nm thick. The resist film 3 is formed from a positive chemically amplified resist sensitive to electron beams. The resist film with this thickness functions as a half-tone film which produces a phase difference of $3\pi$ for light having a wavelength of 248 nm.

Figure 6B:
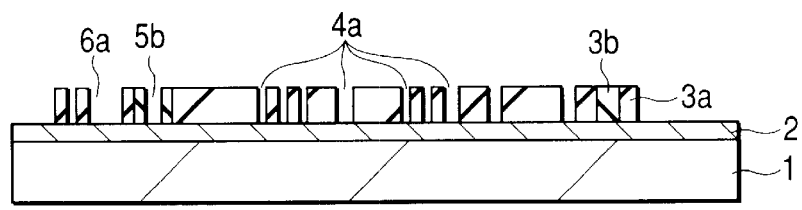

Development is performed in the subsequent step. Thus, there is obtained the resist pattern 3a, which includes circuit patterns 4a, a reticle aligning mark pattern, a wafer aligning mark pattern 5b, and a fine shade pattern 3b, as shown in FIG. 6(b). An opening 6a in the resist pattern 3a corresponds to the place where the pellicle frame is placed in the later step.

Figure 6C:
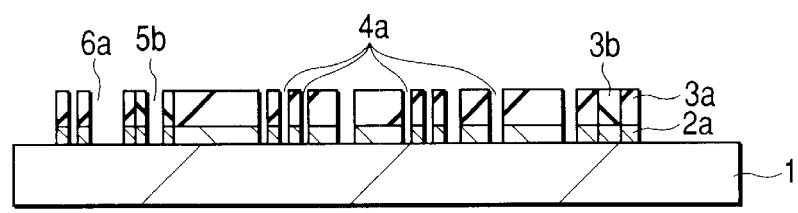

Etching is performed on the chrome film as an attenuator, so that the attenuator pattern 2a is formed as shown in FIG. 6(c). This etching is wet etching with an aqueous solution of diammonium cerium (IV) nitrate, although dry etching is also acceptable.

Figure 6D:
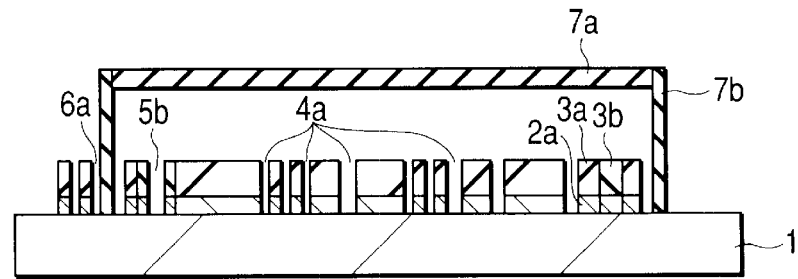

The glass substrate 1 is provided with a pellicle frame 7b having a pellicle film 7a, as shown in FIG. 6(d). Thus there is obtained the desired half-tone phase-shift mask for a KrF excimer laser. The base of the pellicle frame 7b is attached directly to the glass substrate 1 through the previously formed opening 6a. This produces the same effect as explained above with reference to FIG. 4(f).

Figure 7:
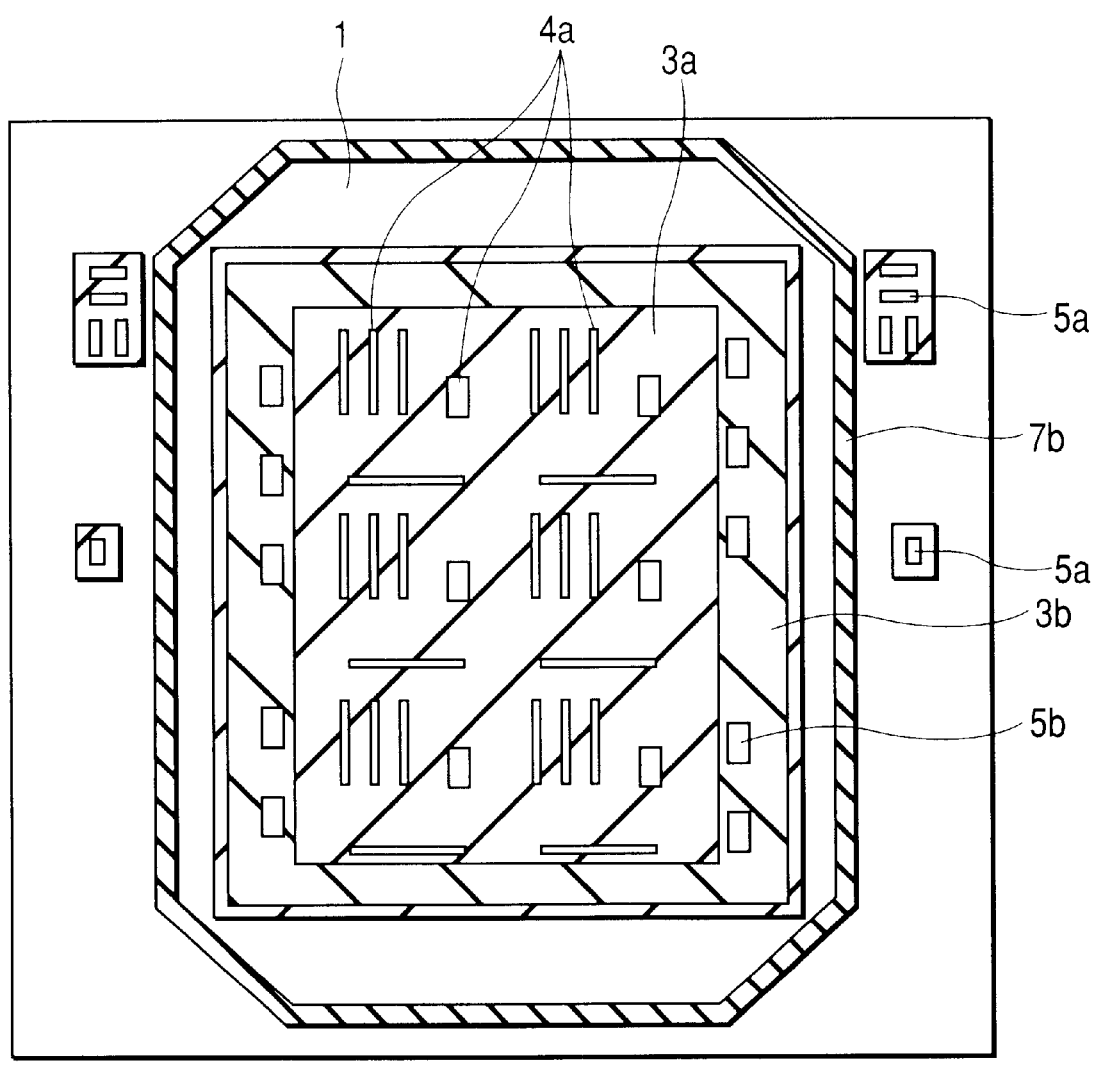
FIG. 7 is a plan view of the photomask shown in FIG. 6.

FIG. 7 is a plan view showing the half-tone phase-shift mask prepared in this example. On the glass substrate 1 are formed circuit patterns 4a, the reticle aligning mark pattern 5a, the pellicle frame 7b, and the shade band 3b. In this case, the reticle aligning mark pattern 5a is formed outside the pellicle frame 7b; however, this position varies from one exposure system to another. There may be an instance where the reticle aligning mark pattern 5a is placed inside the pellicle frame 7b.

In the region of the shade band 3b is formed the wafer aligning mark pattern 5b. In other words, the mark pattern 5b is formed by removing and opening a part of the shade band 3b. The wafer aligning mark pattern 5b is a reference mark for layer alignment. This mark pattern 5b is transferred to the wafer and the pattern is inscribed on the wafer by etching. The mark pattern is detected as a reference for the wafer position, and this mark is used as a reference for later alignment. This mark pattern 5b should preferably be formed within the region of the shade band 3b having a high shading rate. In the hole formation frequently used in the half-tone phase-shift mask, the main body pattern is greatly affected by light diffraction, and hence the dose at the time of wafer exposure becomes large. Because the wafer mark aligning pattern 5b is preferably one order of magnitude larger than the main body pattern, an adequate dose is smaller as compared with the main body pattern.

Moreover, in the case of a half-tone field that transmits more than several percent of the exposure light, the effect of lens aberration at the time of wafer exposure is added, the magnitude of subpeaks changes, and the right-left symmetry of the pattern breaks, producing adverse effect on the reference mark. If the wafer aligning mark pattern 5b is formed within the region of the shade band 3b, it is possible to make null the amount of light of the field part, and consequently it is possible to reduce the adverse effect. Therefore, it is possible to improve the detection precision of the aligning mark pattern 5b and hence, it is possible to improve the yield and reliability of semiconductor devices.

Figure 8A:
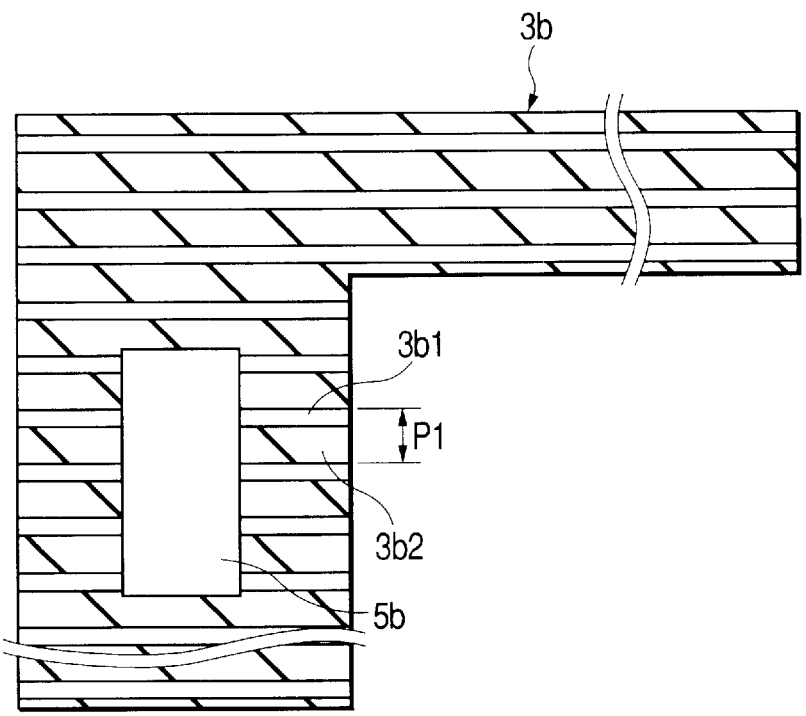
FIGS. 8(a) and 8(b) are enlarged plan views showing important parts of the photomask shown in FIG. 7.
Figure 8B:
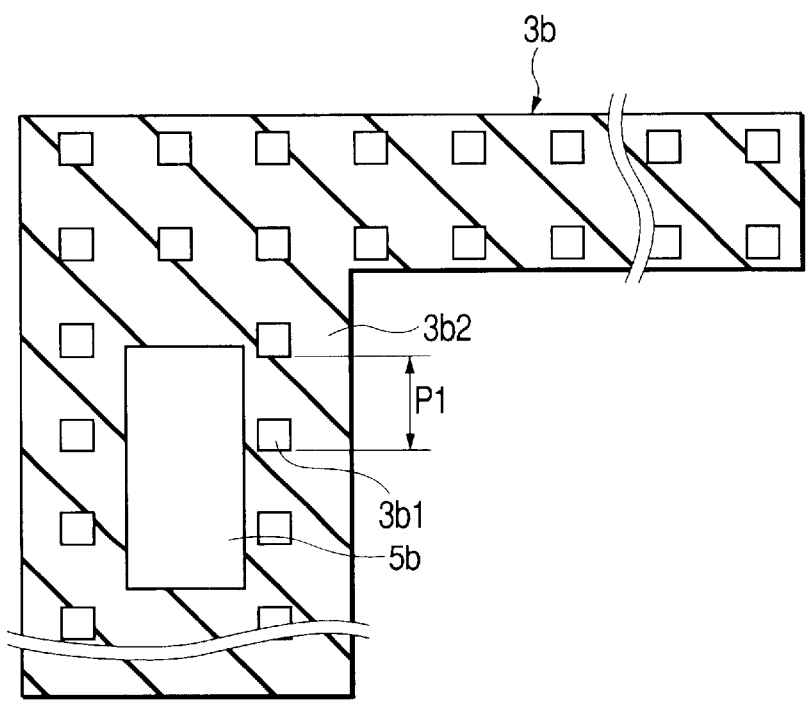

FIG. 8 is an enlarged plan view showing important parts of the shade band 3b. The shade band 3b includes a fine opening 3b1 and a half-tone part (half-tone field part) 3b2. In FIG. 8(a), this fine opening 3b1 is formed in stripes, and the fine opening 3b1 and the half-tone part 3b2 are arranged alternately in the vertical direction at a fine pitch P1. The pattern of the fine opening 3b1 may be in a striped shape as shown in FIG. 8(a) or in the shape of hole as shown in FIG. 8(b), or in a combination of these shapes. In the case of stripes, any of vertical line, horizontal line, and oblique line is acceptable. The pitch P1 for pattern repetition should be $\alpha \cdot \lambda/NA$, and the areal ratio S of the fine opening 3b1 to the half-tone part 3b2 should be $\beta \cdot (T)^{1/2}$, where $\beta$ is the wavelength of exposure light, NA is the aperture number of the projection lens, T is a transmission of the half-tone film, and $\alpha \leq 0.8, 0.5 \leq \beta \leq 2.0$. By using the shade band 3b in this way, it is possible to obtain a sufficient shading ratio.

Sixth Exemplary Mask Production Method

Figure 9A:
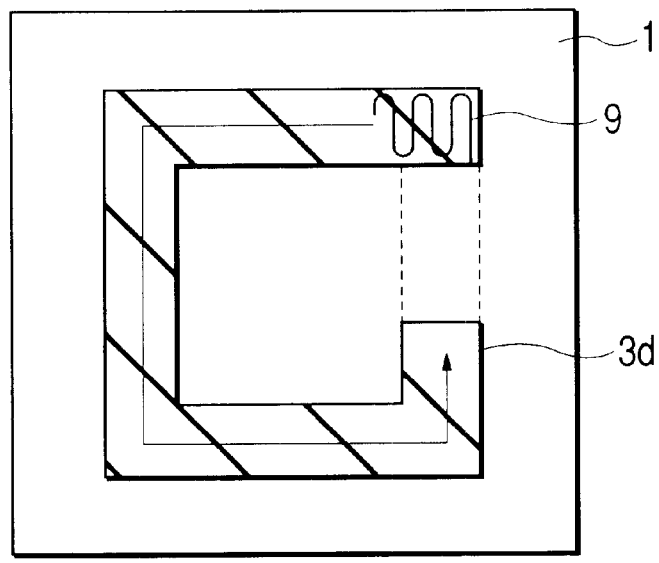
FIG. 9(a) is a plan view and FIG. 9(b) is a side view of the photomask shown in FIG. 9(a) which illustrate a method for producing the photomask used in the production of a semiconductor device according to the present invention.
Figure 9B:
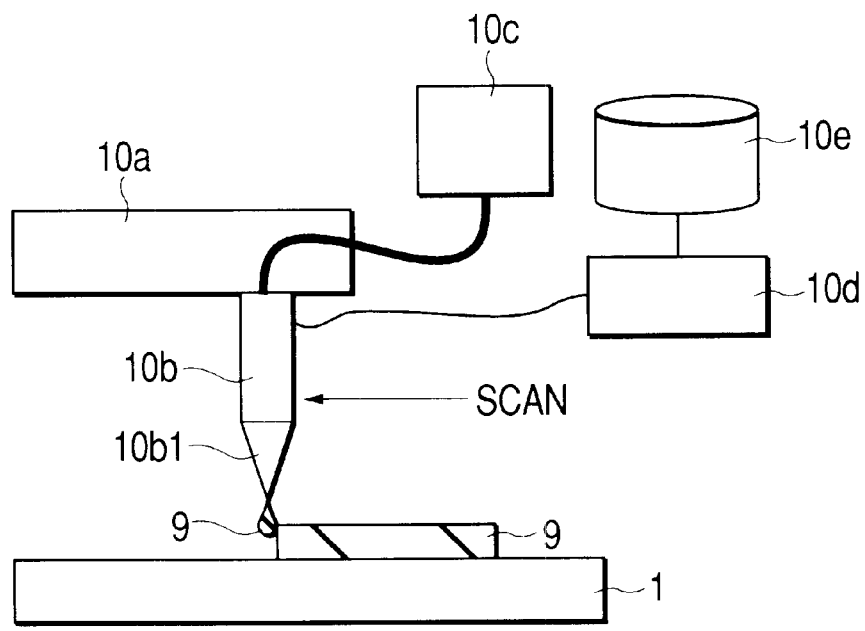

In this method, ink scan coating is used as the method of forming the shade band. FIG. 9 shows the outline of partial application of ink to the shade band. FIG. 9(a) shows the method of coating the shade band 3d on the principal plane (on which the mask pattern is formed) of the glass substrate 1. Ink 9 jets out from the nozzle 10b which is position-controlled by the position control system 10a, and ink 9 is applied to the band while moving zigzag in the direction of arrow on the principal plane of the glass substrate 1 (See, FIG. 9(b)). The jet of ink 9 from the nozzle tip 10b1 is electrically controlled by the control system 10d introduced from the ink supply system 10c, Such that the jet is switched on and off. In the control system 10d, the jet of ink is switched according to the database 10e to determine the coating area. According to the method for partial coating mentioned above, it is possible to save the consumption of ink 9 and to reduce the mask production cost. The ink 9 used is preferably should be a material which does not dissolve the resist (as a photosensitive composition) and has light-screening properties for exposure light. In this case, a water-soluble ink containing a surface active agent may be used.

In the following, we will explain a method of exposure using the half-tone phase-shift mask produced by the first through sixth mask production methods described above will be explained.

Figure 10:
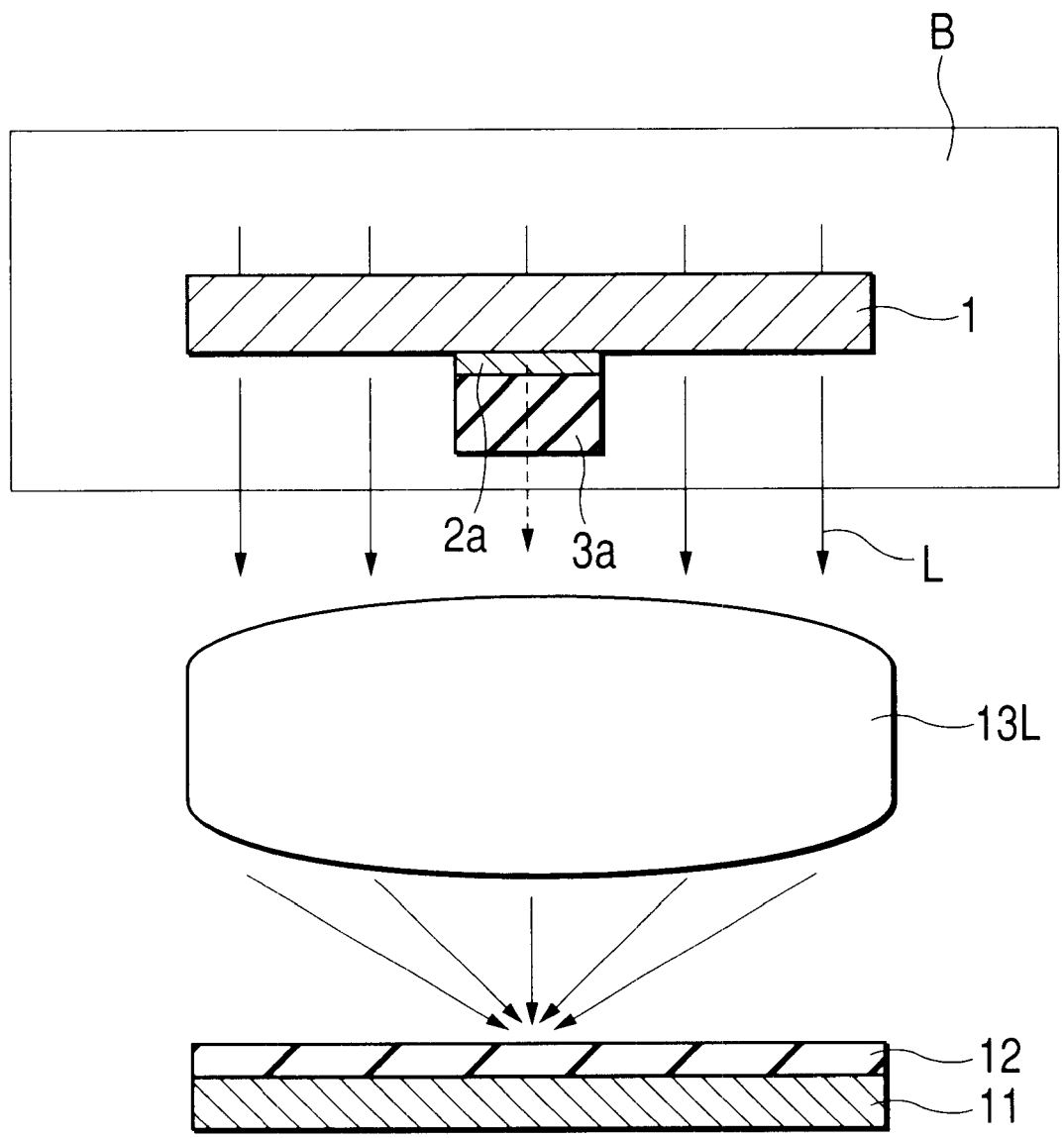
FIG. 10 is a diagram illustrating the exposure step used in the production of a semiconductor device according to the present invention.

FIG. 10 is a diagram illustrating the exposure treatment using the above-mentioned half-tone phase-shift mask. The wafer 11 is made of a silicon single crystal with the resist film 12 deposited on its principal plane (device forming plane). Above the principal plane of the wafer 11 is the above-mentioned half-tone phase-shift mask a the reduction projection lens 13L interposed between them. On the first principal plane of the half-tone phase-shift mask is formed a half-tone film comprised of a thin film pattern 2a and a resist pattern 3a (described above). This half-tone phase-shift mask is arranged such that the first principal plane on which the half-tone film is formed is directed to the reduction projection lens 13L or the principal plane of the wafer 11.

In this state, the exposure light L is irradiated toward the first principal plane from the second principal plane (reverse side or the side opposite to the first principal plane) of the half-tone phase-shift mask and then irradiated to the resist film 12 on the wafer 11 through the reduction projection lens 13L. Thereby, the image of the pattern on the half-tone phase-shift mask is formed on the resist film 12 on the wafer 11, or exposure is accomplished.

At this time, it is desirable that the atmosphere B in which the half-tone phase-shift mask is installed is made an oxygen-poor atmosphere (a non-oxidizing atmosphere) by nitrogen gas purging or the similar method. If the half-tone phase-shift mask of the present example is exposed to an oxidizing atmosphere, the resist pattern 3a suffers film abrasion and pattern thinning. Once the resist pattern 3a suffers film abrasion, the phase angle unfavorably changes. By contrast, if it is made an oxygen-poor atmosphere, the amount of active oxygen, such as ozone, which is generated by exposure decreases, and it is possible to decrease the film abrasion and pattern thinning of the resist pattern 3a. Hence, it is possible to improve the resistance to irradiation with exposure light. There may be an instance in which the atmosphere B contains a gas such as helium (He).

Also, by arranging the resist pattern 3a and the thin film pattern 2a toward the reduction projection lens 13L, the exposure light L is irradiated from the second principal plane of the glass substrate 1 and reaches the resist film 12 on the wafer through the thin film pattern 2a (attenuator thin film 2) containing metal with high resistance to irradiation with exposure light. Therefore, it is possible to reduce by one order of magnitude the amount of irradiation and the exposure intensity to the resist pattern 3a, and hence, it is possible to improve the irradiation resistance of the half-tone film. Specifically, with exposure at a wavelength of 193 nm, the resist damage due to absorption of many photons is large, and therefore, if the exposure intensity decreases, the damage reducing effect of more than proportional relation can be obtained. This exposure method is explained in more detail below.

Figure 11:
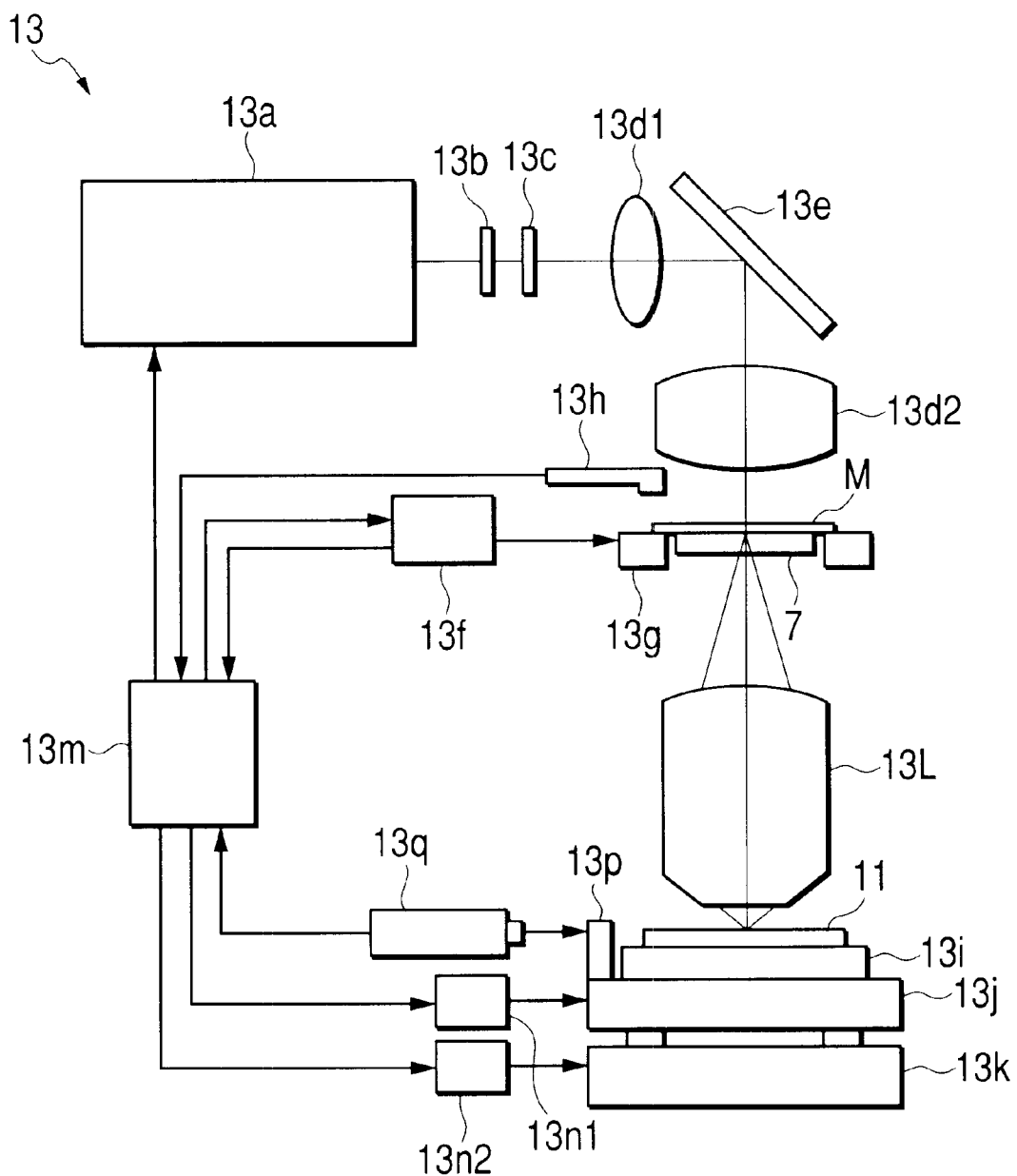
FIG. 11 is a diagram illustrating an example of an exposure system used in the production of a semiconductor device according to the present invention.

An example of the reduction projection exposure system used herein is shown in FIG. 11. The exposure light emitted from the light source 13a of the reduction projection exposure system 13 is incident on the above-mentioned half-tone phase-shift mask M through a fly eye lens 13b, an illumination pattern select aperture 13c, condenser lenses 13d1 and 13d2, and a mirror 13e. On the half-tone phase-shift mask M a masking blade is arranged, so that the size of the opening can be adjusted according to the size of the exposure area. This half-tone phase-shift mask M is mounted such that the first principal plane on which the half-tone film of the above-mentioned structure is formed faces downward (wafer 11 side). Therefore, the above-mentioned exposure light is illuminated through the second principal plane, opposite to the principal plane of the half-tone phase-shift mask M. In this way, the mask pattern drawn on the half-tone phase-shift mask M is projected onto the wafer 11 (the resist film 12 on the wafer 11 as mentioned above), which is the sample substrate, through the reduction projection lens 13L. On the first principal plane of the half-tone phase-shift mask M, the pellicle 7 is arranged to prevent defective pattern transfer due to foreign matter sticking thereto. This pellicle 7 includes the pellicle film 7a and the pellicle frame 7b as mentioned above.

The half-tone phase-shift mask M is preferably vacuum-sealed onto the mask stage 13g which is controlled by the mask position controller 13f, such that its center is accurately aligned with the optical axis of the projection lens. The wafer 11 is vacuum-sealed onto the sample stage 13i. The sample stage 13i is mounted on the Z-stage 13j which is movable in the direction of the optical axis (or Z axis) of the reduction projection lens 13L, and is further mounted on the XY-stage 13k. The Z-stage 13j and the XY-stage 13k are driven by the drivers 13n1 and 13n2 according to the control instructions from the main controller 13m, and therefore can be moved into the desired exposure position. The position is accurately monitored by the laser measuring system 13q as this position of the mirror 13p fixed on the Z-stage 13j. The position detector 13h may be a halogen lamp, for example.

The occurrence of foreign matter caused by transfer is prevented by exposing the resist film on the half-tone phase-shift mask M so that the resist film does not remain on the part which comes into contact with the stage of the exposure system and the transfer system. In the case where this treatment is not performed, foreign matter may occur and cause transfer defects.

The pattern of the half-tone phase-shift mask M in this embodiment is mounted on the above-mentioned exposure system, and step & scan exposure is performed to transfer the resist 12 onto the wafer 11. As a result, no transfer defects occur and the dimensional accuracy improves by about 8 nm as compared with the ordinary half-tone phase-shift mask. Despite exposure through the four-times reduction optical system, improvement in dimensional accuracy of the half-tone phase-shift mask M led to such an improvement in the dimensional accuracy owing to MEF (Mask Error Enhance Factor). Also, because the shade band 3b is formed on the half-tone phase-shift mask M, no problems arise even in the multi-exposure part between shots.

Figure 12:
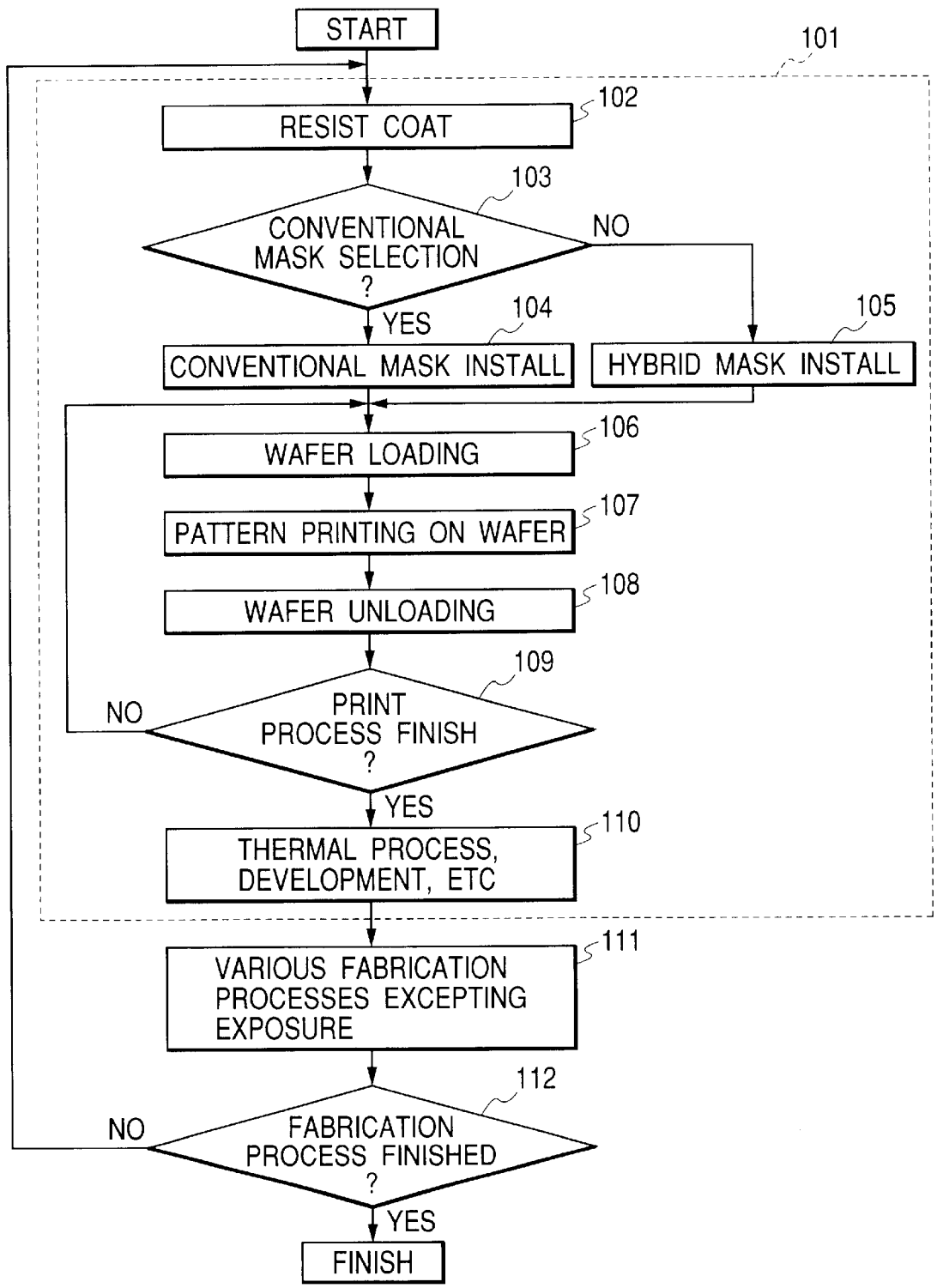
FIG. 12 is a flow diagram of an exemplary process for producing a semiconductor device according to the present invention.

Next, an exemplary method for manufacturing a semiconductor device according to the present invention will be explained with reference to FIG. 12. Step 101 is a pattern transfer step to transfer the master pattern onto the wafer 11, and step 111 is a step to carry out various fabrication procedures such as etching and film forming. In the ordinary semiconductor device, the pattern transfer and various fabrication are repeated until it is judged that all fabrications in step 112 are completed.

Now, in this embodiment, in the pattern transfer step 101, after the resist film has been applied to the wafer 11 (step 102), a selection is made by step 103 as to whether to use an ordinary (conventional) mask (such as a half-tone phase-shift mask having a chrome film or an inorganic half-tone film) or a hybrid-type half-tone phase-shift mask ("hybrid mask" hereinafter) which has a laminate film comprised of an organic photosensitive resin and a metal-containing thin film as mentioned above. Here, in the case where the number of wafers to be exposed per mask is smaller than the prescribed value, the hybrid mask is prepared separately as described below.

Subsequently, the selected ordinary mask or hybrid mask is placed on the exposure system in step 104 or 105, and then the resist pattern is formed on the wafer 11 through steps 106 to 110.

Next, with reference to FIG. 13, an example of the use of the above-mentioned half-tone phase-shift mask in the manufacture of semiconductor devices having the CMIS (Complementary MIS) circuits of twin-well type will be explained. FIGS. 13(a) to 13(f) are sectional views showing important parts of the wafer 11 during the course of manufacturing.

The semiconductor substrate 11S (referred to as "substrates" hereinafter) comprising the wafer 11 is formed from n-type silicon single crystal in a flat round shape, for example.

Figure 13A:
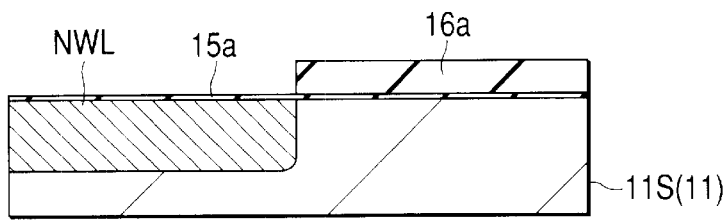
FIGS. 13(a) to 13(f) are sectional views showing important steps in the production of a semiconductor device according to the present invention.

Initially, a wafer alignment mark for mask alignment is formed (not shown) on the substrate 11S. This wafer alignment mark may also be made at the time of well forming by the addition of the selective oxidation step. Afterwards, as shown in FIG. 13(a), an insulation film 15a of silicon oxide (SiO$_2$) or similar material is formed on the substrate 11S. Following this step, the resist pattern 16a for implantation mask is formed on the insulation mask 15a by i-line lithography. The mask used at this time is an ordinary chrome mask. Then, the substrate 11S is doped with phosphorus, for example, by ion implantation through the above-mentioned resist pattern 16a as a mask. Thus, the n-well (NWL) is formed.

Figure 13B:
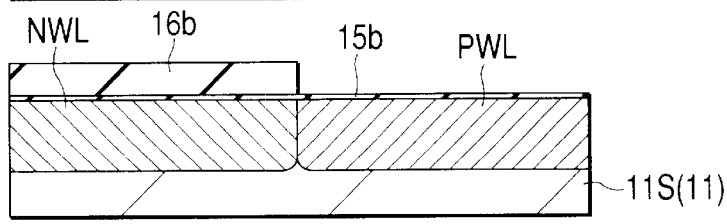

The resist pattern 16a and the insulation film 15a are then removed by ashing. As shown in FIG. 13(b), the insulation film 15b of silicon oxide is formed on the substrate 11S and then the resist pattern 16b for implantation mask is formed on the insulation film 15b by i-line lithography. The mask used at this time is also an ordinary chrome mask. The substrate 11S is then doped with boron (B), for example, by ion implantation through the above-mentioned resist pattern 16b as a mask. Thus, the p-well (PWL) is formed.

Figure 13C:
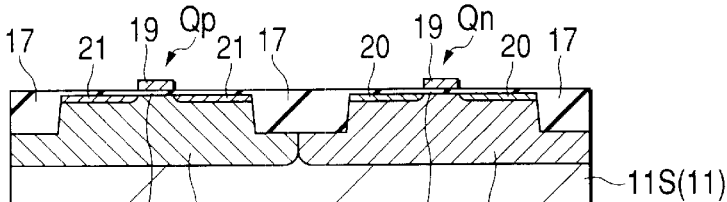

Thereafter, the resist pattern 16b and the insulation film 15b are removed, and the field insulation film 17 (e.g., silicon oxide film) for isolation is formed in the form of trench isolation in the first principal plane of the substrate 11S, as shown in FIG. 13(c). As the isolation method, the LOCOS (Local Oxidation of Silicon) method may also be used. For lithography at the time of isolation forming, a reduction projection exposure system with KrF excimer laser and an ordinary chrome mask are preferably used.

Thereafter, nMISQn and pMISQp are formed in the active region surrounded by this field insulation film 17. The gate insulation film 18 of nMISQn and pMISQp are silicon oxide film, for example, which is formed by thermal oxidation. The gate electrode (wiring) 19 of nMISQn and pMISQp is formed as follows. A gate forming film of low-resistance polysilicon, for example, is deposited by CVD or a similar method. This film is patterned by lithography with a reduction projection exposure system with KrF an excimer laser and the hybrid mask prepared according to the fifth exemplary mask production method. The patterned film then undergoes etching. The resist film on the wafer 11 is preferably a phenolic-based chemically amplified resist. In this case, the resist film may be of negative type or positive type. The gate electrode 19 may also be formed by lithography with a reduction projection exposure system with ArF excimer laser and the hybrid mask prepared according to the third exemplary mask production method. An ArF excimer laser has a larger exposure latitude for resolution of fine patterns owing to its shorter wavelength.

The n-type semiconductor region 20 of nMISQn is formed by ion implantation of phosphorus or arsenic, for example, into the substrate 11S through the gate electrode 19 as a mask for self-alignment. The p-type semiconductor region 21 of pMISQp is formed, for example, by ion implantation of boron into the substrate 11S through the gate electrode 19 as a mask for self-alignment. In this example, the gate electrode 19 is a film formed from low-resistance polysilicon alone; however, it may also be a film of so-called "polycide" structure consisting of a low-resistance polysilicon film and a silicide film of tungsten silicide or cobalt silicide. It may also be a film of so-called "polymetal" structure consisting of a low-resistance polysilicon film and a metal film of tungsten or the like, with a barrier conductor film (such as titanium nitride and tungsten nitride) interposed there between.

Figure 13D:
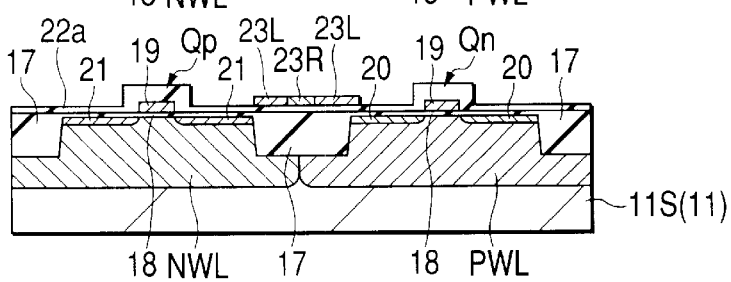

Initially, as shown in FIG. 13(d), an interlayer dielectric layer 22a of silicon oxide film is deposited on the substrate 11S, for example, by a CVD (Chemical Vapor Deposition) or similar method, and polysilicon film is deposited thereon by CVD or similar method. Lithography is then performed on the polysilicon film, and after patterning by etching, an impurity is introduced into the prescribed region of the patterned polysilicon film, whereby the wiring 23L and resistance 23R of polysilicon film are formed.

Figure 13E:
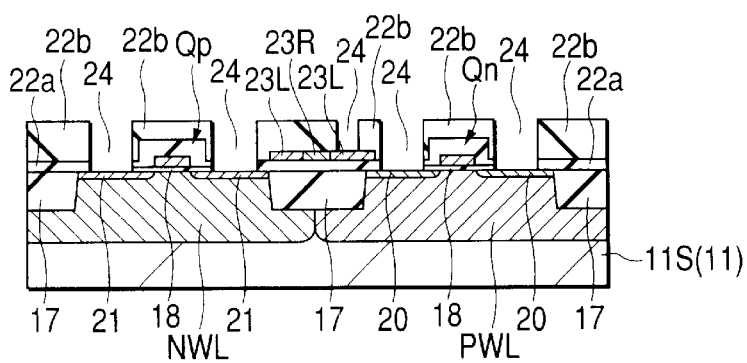

Thereafter, as shown in FIG. 13(e), an interlayer dielectric film 22b of, for example, silicon oxide is deposited on the substrate 11S by CVD or similar method. A contact hole (wiring) 24 which exposes a part of the semiconductor regions 20 and 21 and the wiring 23L in the interlayer dielectric films 22a and 22b by lithography using the reduction projection exposure system with KrF excimer laser and the hybrid mask prepared according to the above-mentioned fifth exemplary mask production method, and by an ensuing etching step. The resist used on the wafer 11S is a chemically amplified resist which is based on a phenolic resin sensitive to a KrF excimer laser beam. In this case, the resist film is of the positive type.

Because the hole diameter of the contact hole 24 herein is, for example, 0.18 µm KrF excimer laser exposure was used. In the case where a hole diameter smaller than 0.15 µm is necessary, ArF excimer laser exposure may be used. In this way, it is possible to stably resolve a hole diameter smaller than about 0.15 µm. On this occasion, the thickness of the resist film on the half-tone phase-shift mask should be established such that phase reversal takes place (phase difference becomes about λ or 3λ) for an ArF excimer layer beam, for example.

Figure 13F:
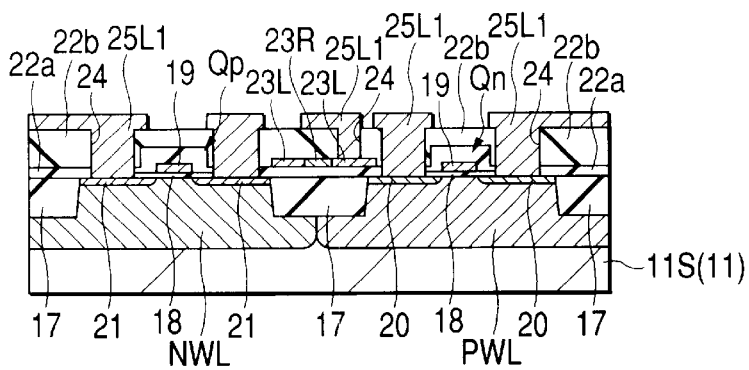

Furthermore, metal films such as titanium (Ti), titanium nitride (TiN), and tungsten (W), for example, are sequentially deposited on the substrate 11S by a sputtering method and CVD method. Then, the metal films undergo lithography using a reduction projection exposure system with a KrF excimer laser and the hybrid fifth exemplary mask prepared according to the above-mentioned mask production method and undergo etching. Thus, the first-level interconnect (wiring) 25L1 is formed as shown in FIG. 13(f). Thereafter, in the same way as the first-level interconnect 25L1, the second-level interconnect is formed, and the semiconductor device is formed. Since the wiring pitch herein is, for example, 0.36 µm, a KrF excimer laser exposure is employed; however, in the case where a wiring pitch pattern smaller than 0.3 µm is formed for relation with resolution, ArF excimer laser exposure is used.

For custom LSI products, it is common practice to carry out mask debugging mainly on the first-level interconnect 25L1. The speed of the mask supply TAT (Turn Around Time) to the first-level interconnect 25L1 determines the product development power and the number of masks required increases. Therefore, it is particularly effective to apply to this step the hybrid mask with high yields due to mask precision.

Also, the distribution and dispersion of mask dimensions are aggravated at the time of transfer due to the relationship with MEF. Consequently, in a case where an ordinary mask is used, the dispersion of dimensions is large. However, in the exposure treatment using the hybrid mask according to the present embodiment, the dimensional accuracy of the mask itself is high, and hence, such a problem can be reduced or prevented. In particular, because a dimensional accuracy is required in the gate interconnect forming step, the hybrid mask with a high dimensional accuracy may be especially effective. Moreover, in the formation of the contact hole 24, because MEF is large, the hybrid mask with a high mask dimensional accuracy is effective in improving the transfer dimensional accuracy.

As the hybrid mask, a hybrid mask prepared according to the above-mentioned fifth exemplary mask production method is mainly used herein, but positive results may also be obtained even when other hybrid masks are used. Since the accuracy and yield are high, the production cost of the mask is decreased, and since the production period is short, it is possible to reduce the production cost of semiconductor devices having CMIS circuits. It may also be possible to produce semiconductor devices having CMIS circuits in a decreased period of time. Moreover, it is possible to reduce the development TAT for semiconductor devices having CMIS circuits.

EXAMPLE 2

The present example illustrates the use of a hybrid mask that is superior in resistance to exposure illumination and change over time. The half-tone phase-shift mask explained in Example 1 above uses a photosensitive organic film typified by a resist film as the half-tone mask. Therefore, after prolonged use and as the number of exposures increases, the thickness of the photosensitive organic film decreases and the phase changes. This limitation is addressed below.

Figure 14:
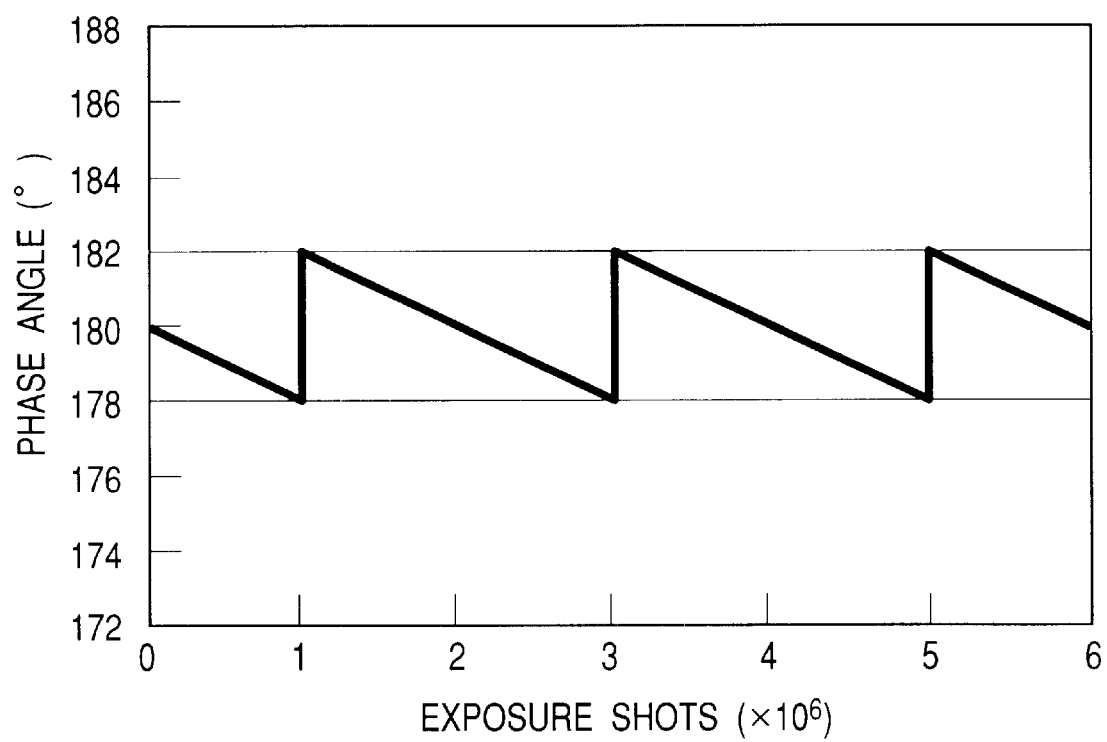
FIG. 14 is a graph showing the phase angle of the photomask used in the production of a semiconductor device according to the present invention.

In the present example, the phase is measured while the half-tone phase-shift mask is being used, and if the phase is out of the desired value, an adjustment is made by digging the glass substrate 1 such that the desired phase difference is obtained between the light passing through the half-tone film and the light passing through the opening without half-tone film. FIG. 14 charts the change of phase angle against the number of exposure shots. As shown in FIG. 14, the cumulative amount of exposure light or the phase angle is monitored, and if the result of monitor is lower than the reference value, the glass substrate 1 is dug as much as desired and the phase angle is adjusted.

In the case of FIG. 14, the glass substrate 1 is dug in an amount corresponding to a phase angle of 4° each time the number of shots reaches $1 \times 10^6$, $3 \times 10^6$, $5 \times 10^6$, etc. Since the amount of exposure light for one shot is about 400 J/m² on the wafer, digging in the glass substrate 1 is carried out each time the cumulative amount of exposure light reached about 400 MJ/m², 1200 MJ/m², 2000 MJ/m², etc. in linkage with the production steps of semiconductor devices. In this way, it is possible to add the step of digging the glass substrate 1 by controlling based on the cumulative amount of exposure light, but, in the case where higher accuracy control is necessary, the phase angle of the half-tone film may be measured by using the laser interference method. Control is then accomplished so that the angle is within 180±2°, for example.

Figure 15A:
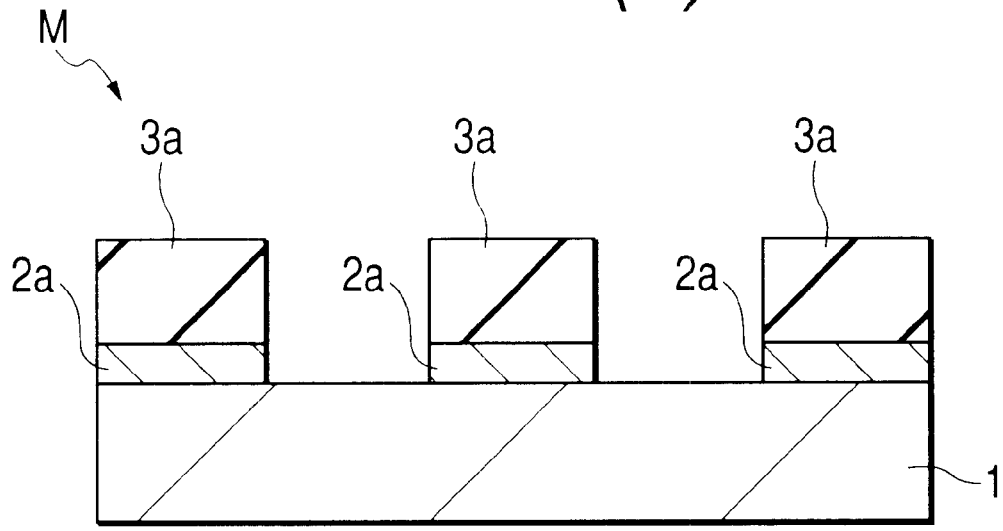
FIGS. 15(a) and 15(b) are diagrams illustrating the adjustment of the phase of the photomask used in the production of a semiconductor device according to the present invention.
Figure 15B:
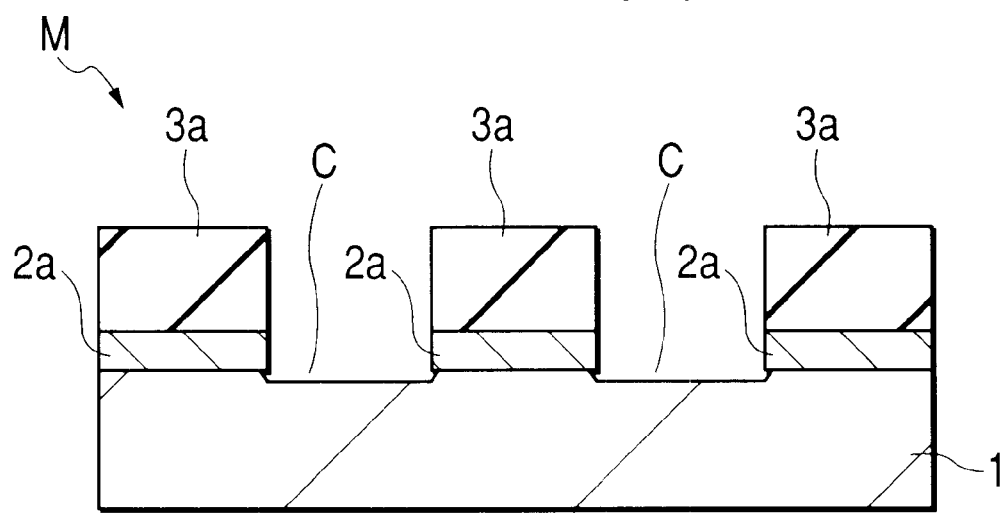

Next, a method for fine adjustment of the hybrid mask by digging in the glass substrate 1 will be explained with reference to FIG. 15. FIG. 15(a) is an enlarged sectional view showing important parts of the half-tone phase-shift mask (shown in the first through sixth exemplary mask production methods, above) which has a glass substrate 1, a thin film pattern 2a, and a resist pattern 3a. Here, in the case where the phase angle has changed due to a change over time or a change caused by exposure illumination, the exposed surface C (the parts exposed from the thin film pattern 2a and the resist pattern 3a) of the glass substrate 1 is dug by etching so that the desired phase difference is obtained. This etching may be accomplished by dry etching; however, wet etching permits easy adjustment of the phase angle without an appreciable loss of film thickness of the resist pattern 3a.

As an example, as the thin film pattern 2a which functions as the attenuating film, chrome is used, and etching was performed on the glass substrate 1 with a wet etching solution which is a 60:1 mixture (by volume) of ammonium fluoride and hydrofluoric acid. Also, the phase difference was measured using a laser interferometer between the half-tone film comprised of a thin film pattern 2a and a resist pattern 3a and the opening (glass surface) from which the half-tone film has been removed. The amount of etching necessary for the phase reversal to take place between them was obtained and etching was performed accordingly. In this way it was possible to narrow down the phase difference to the desired value (phase reversal state) with a high precision.

In fact, this method made it possible to narrow down the phase difference to the target value with a precision of ±1°. This adjustment is possible because the change with time and change by exposure illumination take place in the direction toward the thinning of the film thickness.

EXAMPLE 3

Semiconductor devices (custom LSI (Large Scale Integrated Circuits)) such as gate arrays have a fixed pattern for the gate array diffusion layer (master layer) which is common to various customers. On the other hand, the wiring layer in the upper layer is typically a custom layer which is subject to correction or modification according to a customers' demand.

Therefore, in this Example 3, the pattern for the above-mentioned master layer is formed using the above-mentioned ordinary mask in the stage of development and trial production before mass production and in the stage of mass production. The pattern for the above-mentioned custom layer is formed by using the above-mentioned hybrid mask before debugging according to the customer's specification is completed, and when the customer's approval for mass production is obtained, the hybrid mask is switched to the ordinary mask for mass production of the custom LSI.

Figure 16:
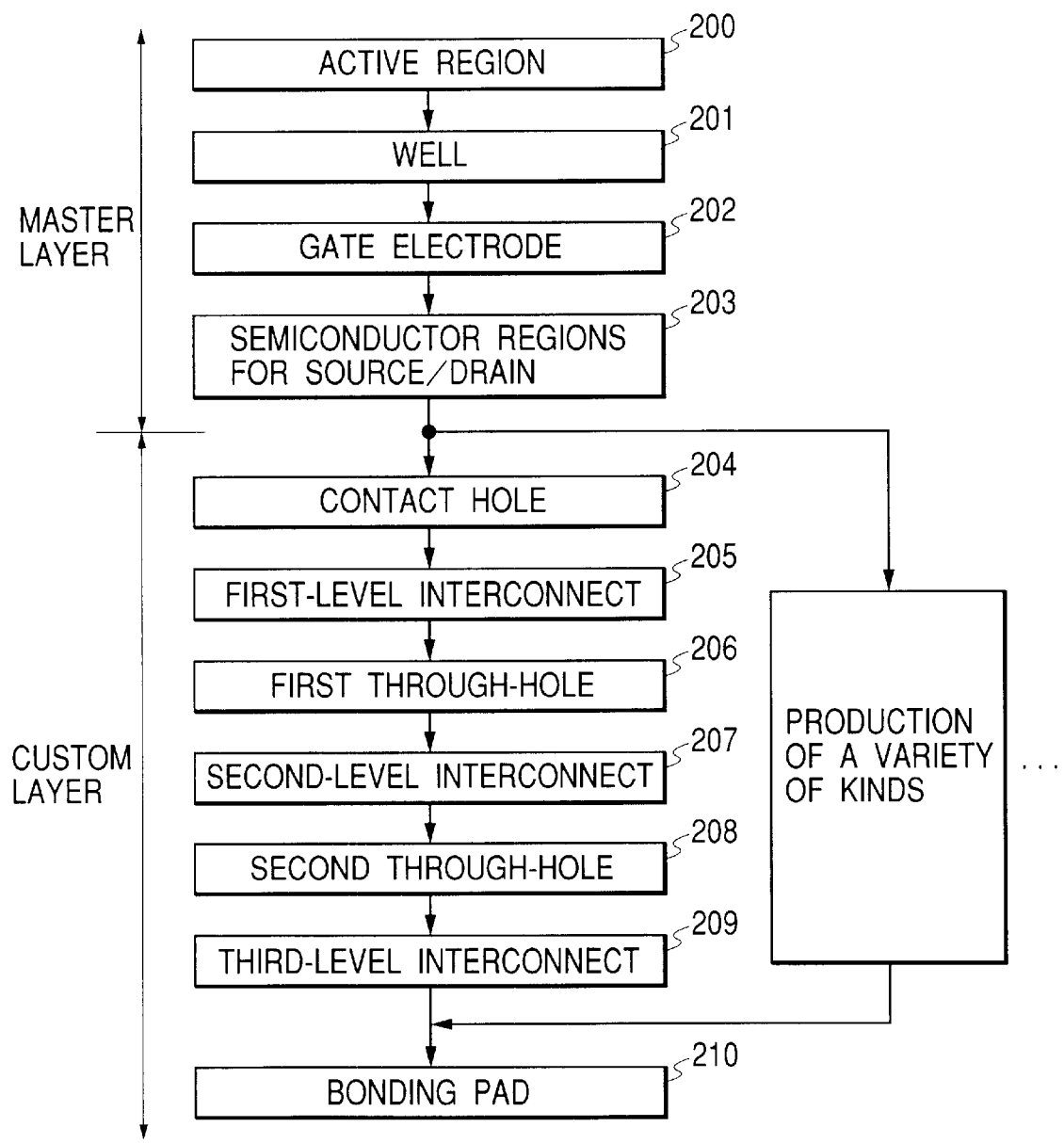
FIG. 16 is a flow diagram showing another example of the process for producing a semiconductor device according to the present invention.

FIG. 16 is an example of the production flow of semiconductor devices according to this example. In step 200 of forming the active region, step 201 of forming the well, step 202 of forming the gate electrode, and step 203 of forming the semiconductor region for source/drain, the ordinary mask (including the half-tone mask of inorganic film type) is used. In step 204 of forming the contact hole, step 205 of forming the first-level interconnect, step 206 of forming the first through hole, step 207 of forming the second-level interconnect, step 208 of forming the second through hole, and step 209 of forming the third-level interconnect, the hybrid mask is used in the stage of development and the ordinary mask (including the half-tone mask of inorganic film type) is used in the stage of mass production. Step 210 of forming the bonding pad is included in the custom layer. In this step, the mask may be used; but it is possible to form without any mask. In such a case, it is desirable to prepare a menu for custom LSI (such as FPGA (Field Programmable Gate Array) by flash memory (EEPROM: Electric Erasable Programmable Read Only Memory), gate array by the hybrid mask, and gate array by the ordinary array), so that the customer chooses from the menu the desired type according to quantities.

According to this example, the precision and yield of the hybrid mask are high and it is possible to rapidly offer a mask for commercial production, and hence, it is possible to greatly reduce the period for development of a custom LSI without being limited by the mask supply. It is also possible to offer a custom LSI meeting the customer's requirements. In addition, because the mask cost decreases owing to improvement in mask yields, it is possible to greatly decrease the cost for development of custom LSI. Therefore, the manufacturer is able to produce a large variety of custom LSIs in small quantities. In other words, the manufacturer may undertake the production of a large variety of custom LSIs in small quantities which would otherwise be rejected. Thus, it is possible to increase the total sales amount. In addition, the customer can acquire highly reliable custom LSIs meeting the desired specifications at a reduced cost.

EXAMPLE 4

Figure 17:
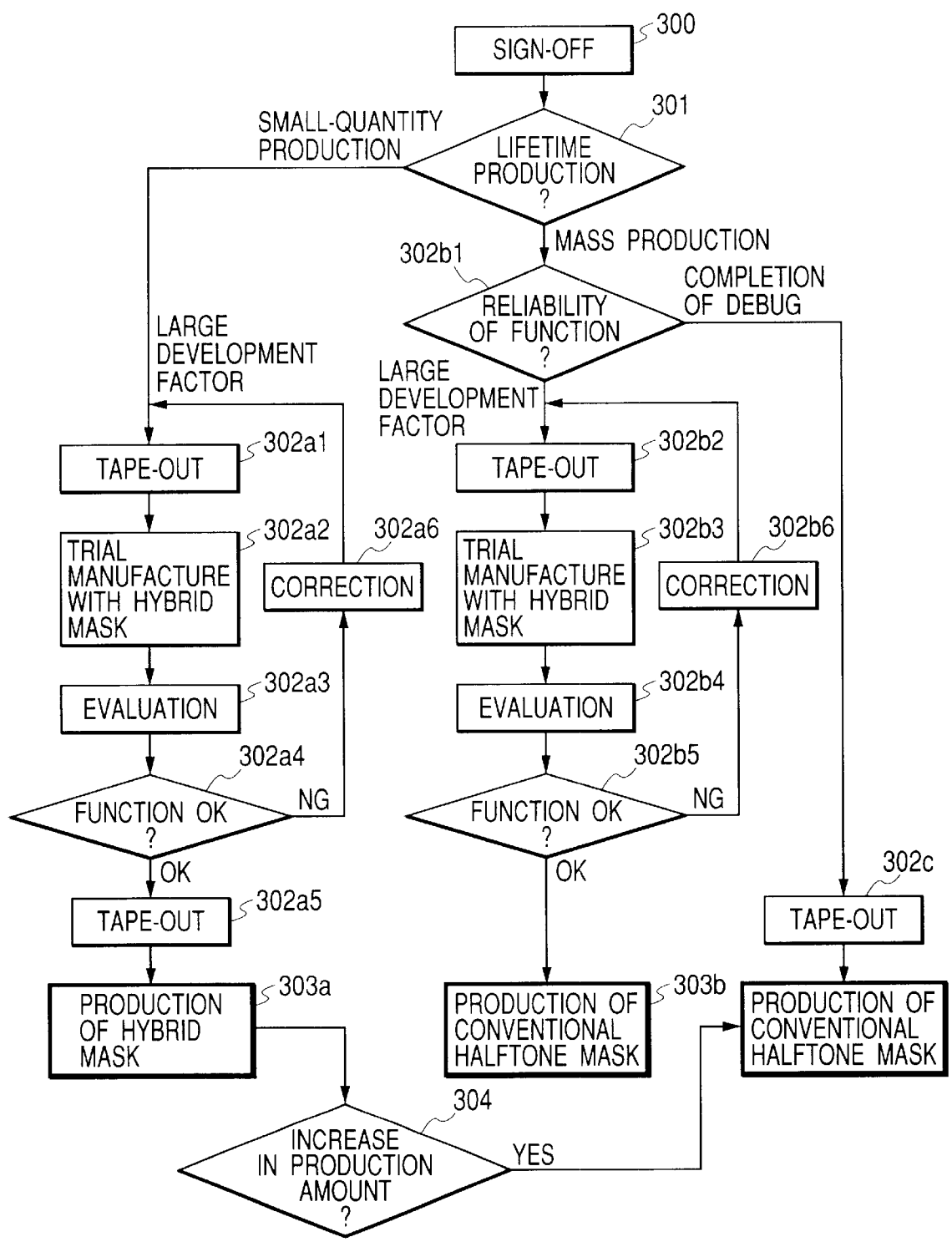
FIG. 17 is a flow diagram showing an exemplary process for producing the photomask used in the production of a semiconductor device according to the present invention.

This example demonstrates the production of a mask used to produce a semiconductor device according to another example of the present invention. FIG. 17 is an example of the flow of production of the mask which the customer selects to produce semiconductor devices.

Initially, the pattern layout design data for the mask is established using the pattern layout design data of the semiconductor device (step 300). A determination is made as to whether or not the semiconductor device is a product suitable for lifetime production (step 301). The criterion for judgment on lifetime production is made by using the following equation:

Total unit cost of semiconductor device=((Expense for mask× Number of anticipated changes+Other expenses)/Number of lifetime production)+Production cost.

In this equation, "other expenses" include costs for development, for example. By estimating the ratio of mask expense in the total unit cost at a certain value, e.g., 2%, a threshold value for the number of lifetime production is obtained. If the number of semiconductor devices to be produced is larger than the threshold value, then it is determined to be a lifetime production and otherwise it is a non-lifetime production.

In the case where the semiconductor device is not a lifetime production (or the number of lifetime production is smaller than the above-mentioned threshold value), the left-side flow in FIG. 17 is applicable, and the above-mentioned hybrid mask is used as the half-tone phase-shift mask. That is, the left-side flow in FIG. 17 moves to the stage of production of a semiconductor device using the hybrid mask through the stage of trial production of the hybrid mask. In the stage of production of semiconductor device by the hybrid mask from the stage of trial production of the hybrid mask, after Tape-Out (step 302a1) for semiconductor device with a large development factor, the hybrid mask for production of the semiconductor device is made for trial (step 302a2). The trial hybrid mask is then evaluated (step 302a3) and subsequently examined for whether its function is acceptable or not (step 302a4). If a determination is made that the function is successful, after Tape-Out (step 302a5), the semiconductor device is produced by using the hybrid mask at the time of exposure treatment. On the other hand, if it is determined that the function is unsuccessful, corrections are made (step 302a6) on the hybrid mask produced for trial as mentioned above, and the steps from Tape-Out (step 302a1) are repeated again.

In the case where the hybrid mask is used, the precision and yield are high, and hence, it is possible to easily correct and change the mask pattern in a short time with reduced expenses for materials, operation, and fuel. Therefore, by applying this flow to the stage of development or the stage of trial production (before mass production) of semiconductor devices, it is possible to reduce the development period and trial production of semiconductor devices. Also, it is possible to reduce the expenses for development and trial production of semiconductor devices. Therefore, even in the case of semiconductor device for comparatively small production quantities, it may be possible to produce the device at a comparatively low cost.

In a subsequent stage in which the demand for the semiconductor device has grown, a determination is made whether the production quantity has increased or not (step 304), and in the case where an expansion of production number is recognized, the flow moves to the far right side, in which the above-mentioned ordinary mask can be used as the mask. The determination on the expansion of the production number is the same as that for the above-mentioned life-time production. The ordinary mask (including the halftone phase-shift mask of inorganic film type) has good durability and high reliability and can be used for mass exposure treatment, and hence, it is better suited for mass production. In other words, when the expansion of production number of semiconductor device is recognized (or at the time of shift to mass production), the ordinary mask is used to improve the reliability of the mask at the time of mass production. Thus, it is possible to improve the reliability and yield of the semiconductor device to be produced by using the conventional mask.

Also, if the determination is made in step 301 that the semiconductor device is a lifetime production (or if the number of lifetime production is larger than the above-mentioned threshold value), then a determination is made on the reliability of function (step 302$b$1). This step is to judge whether or not the semiconductor device has a reliable function. If it is found from the result of this determination that many development factors are contained in the customer's design and the mask needs several corrections and changes, then the central flow in FIG. 17 is followed.

In the central flow in FIG. 17, the above-mentioned hybrid mask is used as the half-tone phase-shift mask in the development stage and trial production. Thereafter, at the time when the target specification is determined to be satisfactory to the customer, then an ordinary mask (including the half-tone phase-shift mask of inorganic film type) is produced and made ready for mass production. Here, after Tape-Out (step 302$b$2) for a semiconductor device with a large development factor, the hybrid mask for production of the semiconductor device is produced on a trial basis (step 302$b$3). Subsequently, the trial hybrid mask is evaluated (step 302$b$4) and then a determination is made on its function (step 302$b$5). If the on function is successful, an ordinary half-tone phase-shift mask (including the half-tone phase-shift mask of inorganic film type) is produced and exposure treatment using this mask is carried out to produce the semiconductor device.

On the other hand, if the function is unsuccessful, the above-mentioned trial hybrid mask is corrected (step 302$b$6) and the steps from Tape-Out (step 302$b$2) are repeated all over again. Thereafter, at a time when the target specification is determined to be satisfactory to the customer, then the ordinary mask (including the half-tone phase-shift mask of inorganic film type) is produced, and the semiconductor device is produced using this mask at the time of exposure treatment (step 303$b$).

In the unstable stage, such as development and trial production of semiconductor device, in which the reliability of function is uncertain, it is possible to change and correct the mask pattern in a short time. In addition, by using the hybrid mask that can be produced at a low cost, it is possible to reduce the period for development and trial production of a semiconductor device. It is also possible to greatly reduce the expenses for development and trial production of semiconductor device. On the other hand, once the device's function has been confirmed, the ordinary mask (including the half-tone phase-shift mask of inorganic film type) with high durability and reliability is used which can be utilized for mass exposure treatment. In this way it is possible to improve the reliability of the mask at the time of mass production, and hence, it is possible to improve the reliability and yield of semiconductor device produced by using it. Therefore, it is possible to reduce the overall cost of the semiconductor device which is produced after the stages of development, trial production, and mass production as mentioned above. It is also possible to improve the productivity of semiconductor device design.

In the case where the semiconductor device is judged to be a lifetime production article in step 301, the customer's design has been debugged, and the function has been confirmed by the step 302$b$1 for reliability of function, there is only a small possibility of mask change and correction. Therefore, the right side flow in FIG. 17 is followed. That is, after Tape-Out (step 302$c$), an ordinary mask (including the half-tone phase-shift mask of inorganic film type) is prepared from the beginning, and the semiconductor device is manufactured using this mask at the time of exposure treatment (step 303$c$). In this way, it is possible to reduce the overall expenses and cost for the production of semiconductor devices. The above-mentioned exposure treatment may be accomplished by either the step-and-repeat exposure method or the step-and-scan exposure method mentioned above.

At the time of such production of semiconductor device, the manufacturer or supplier of a semiconductor device presents to the customer the style of production of semiconductor device as shown in FIG. 18. Herein, four production types are shown as an example. The types include: "exclusive use of hybrid mask"; "use of hybrid mask for initial production"; "use of hybrid mask for development"; and "exclusive use of conventional half-tone mask". "Exclusive use of hybrid mask" is the type which has been explained in the left-side flow in FIG. 17. "Use of hybrid mask for initial production" is the type which has moved from the left-side flow in FIG. 17 to the right-side flow through step 304. "Use of hybrid mask for development" is the type which has been explained in the center of FIG. 17. "Exclusive use of conventional half-tone mask" is the type explained in the right side flow in FIG. 17. In this way it is possible for the customer to examine the number of lifetime production of semiconductor device expected from the market information (etc). and various factors such as the certainty of the customer's design, and then select the production type most suitable for each product or each production step from the menu shown in FIG. 18. Thus, the customer can easily select the production style requirements.

In addition, the menu for production type mentioned above may be posted by the manufacturer on a web page over the Internet or in various other exclusive communications areas. The customer accesses the web page or the private communications area through communication lines such as an Internet line or private line, such that the customer may select the above-mentioned production type. In this case, it is desirable to construct a navigation system which permits the customer to automatically select the best production type. For example, the above-mentioned web page or private communications area may query the customer who has accessed the system about various factors such as the type in FIG. 18, the amount of production, the expenses of development, the development TAT, and the possibility of pattern change. By having the customer answer the questions one by one, it is possible to automatically select the optimum production type.

The customer menu may also be written, as shown in FIG. 18, on the web page or the private communication area such that the customer must select the desired production type. In this way the customer can simply select the production type most suitable for the product or process to efficiently produce semiconductor devices. Also, the manufacturer becomes able to provide expansive and instant information about various semiconductor devices to the customer. As a matter of course, it is possible to select the production type using telephone lines or other communication means.

Figure 19:
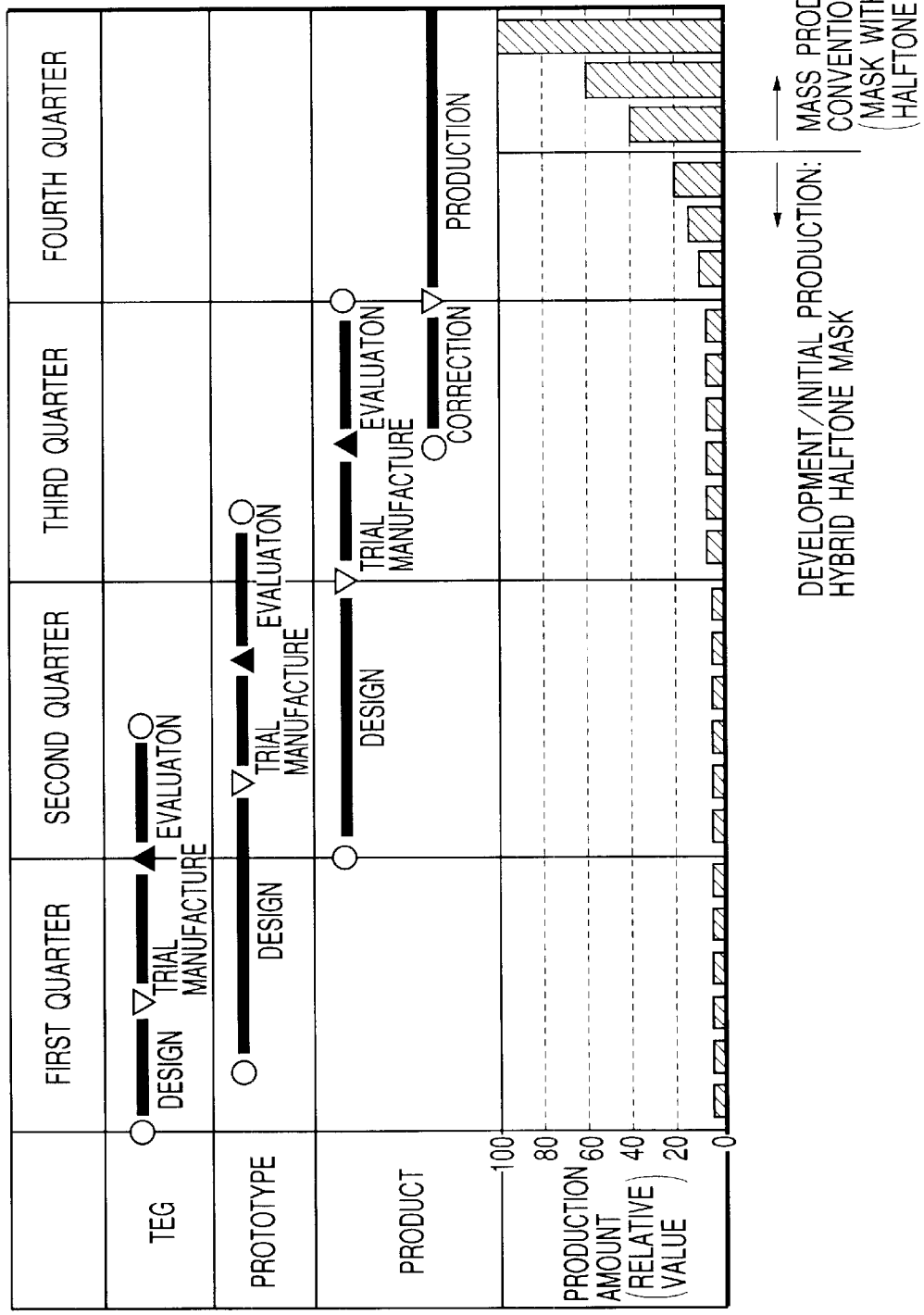
FIG. 19 is a diagram illustrating the use of the photomask in the production of a semiconductor device according to the present invention.

FIG. 19 concretely shows the step of producing semiconductor devices suitable for the type of resist mask development. FIG. 19 shows an example of using the mask differently in the semiconductor manufacturer of vertically integrated type in which the design, development, trial production, and commercial production of a semiconductor device are carried out from beginning to end within a single company. That is, in the stage of development (in the course of the first quarter to the fourth quarter) that ranges over several cuts (units from design to trial production) of TEG (Test Element Group), prototype, and product version, the hybrid mask is used to reduce the expenses of mask and the period of development and trial production. After that, in the stage in which the function of product has been confirmed and the rise of demand has been confirmed, the mask is switched to the ordinary mask (including the half-tone phase-shift mask of inorganic film type) and the production scheme is shifted to the mass production of semiconductor device.

The specific embodiments explained thus far are not intended to restrict the present invention; they may be variously modified without departing from the scope of the present invention.

For example, in the above-mentioned embodiments, an explanation is made about a case in which the wiring is of a conventional structure. The invention is not limited to this. For example, the wiring may be formed by the damascene method or dual damascene method which is designed to form the wiring or plug by burring a conductor film in the trench formed in the insulation film.

Also, in the above-mentioned example, an explanation is made about a case in which the substrate of semiconductor device is a substrate of a semiconductor alone. The invention is not limited to this. For example, the substrate may be an SOI (Silicon On Insulator) substrate in which a thin semiconductor layer is formed on an insulating layer, or an epitaxial substrate in which an epitaxial layer is formed on a semiconductor substrate.

Also, at the time of exposure treatment with various masks, it is permissible to use the modified illumination as mentioned above as the exposure light.

The foregoing description about the invention is based on the area to which is applied the method of manufacturing the semiconductor device having the CMIS circuits. However, the present invention is not limited to this area. The present invention may be applied to semiconductor devices having memory circuits such as DRAM (Dynamic Random Access Memory), SRAM (Static Random Access Memory), and flash memory (EEPROM: Electric Erasable Programmable Read Only Memory), semiconductor devices having logic circuits, such as a microprocessor, and hybrid semiconductor device having both memory circuits and logic circuits on the same semiconductor substrate. The present invention may also be applied to the production of liquid crystal substrates and micromachines.

Typical effects produced by the invention include: improving the dimensional accuracy of a pattern transferred to a wafer and reducing the production and development TAT for semiconductor devices owing to the transfer of the pattern to the resist film on the wafer by the reduction projection exposure method which employs a photomask in which is formed a half-tone phase-shift pattern having an attenuator film and a film of photosensitive material for phase adjustment.

Nothing in the above description is meant to limit the present invention to any specific materials, geometry, or orientation of parts. Many part/orientation substitutions are contemplated within the scope of the present invention. The embodiments described herein are presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A method for manufacturing semiconductor devices, comprising the steps of:

determining whether to use a first half-tone phase-shift mask having a half-tone phase-shifter pattern with an organic film and an attenuator film formed on a first mask substrate or a second half-tone phase-shift mask having a half-tone phase-shifter pattern of an inorganic film formed on a second mask substrate, said determination made according to the production quantity of said semiconductor devices;

preparing a semiconductor substrate having a photosensitive film; and exposing the substrate using said first or said second half-tone phase-shift mask.

2. The method for manufacturing semiconductor devices according to claim 1, further comprising the steps of:

preparing a customer menu including a production type which uses said first half-tone phase-shift mask and a production type which uses said second half-tone phase-shift mask; and receiving selection information from a customer according to said customer menu indicating a semiconductor device type or a semiconductor production type.

3. The method for manufacturing semiconductor devices according to claim 1, wherein said determining step determines whether a projected semiconductor device production quantity is larger than a predefined threshold value, further wherein a second mask is used if the projected semiconductor device production quantity is above said threshold value.

4. The method for manufacturing semiconductor devices according to claim 3, wherein the first mask is used if the projected semiconductor device production quantity is below said threshold value.

5. The method for manufacturing semiconductor devices according to claim 4, further comprising the steps of:

if said projected semiconductor device production quantity is larger than said threshold value, performing the following steps before said exposing step:

determining whether the a function of said semiconductor device is confirmed; and in the case where said function is not yet confirmed, exposing a test substrate using a preliminary half-tone phase-shift mask having a half-tone phase-shifter pattern with an organic film and an attenuator film formed on a preliminary mask substrate.

6. The method for manufacturing semiconductor devices according to claim 5, further comprising the step of:

repeating said determining and exposing steps using additional half-tone phase-shift masks until said function has been confirmed.

7. The method for manufacturing semiconductor devices according to claim 1, wherein said determination step is carried out according to the number of times the substrate is exposed.

8. The method for manufacturing semiconductor devices according to claim 1, further comprising the steps of:

measuring the phase of the exposure light which has been transmitted to said half-tone phase-shifter pattern during said step of exposing the substrate; and adjusting said phase by digging that part of the mask substrate which is exposed from said half-tone phase-shifter pattern in the case where the result of said measurement is not the desired phased.

9. The method for manufacturing semiconductor devices according to claim 1, wherein said exposure step takes place while said half-tone phase-shift mask is installed in a non-oxidizing atmosphere.

10. The method for manufacturing semiconductor devices according to claim 1, further comprising the step of:

repeating said exposure step in a different area of said substrate.

11. The method for manufacturing semiconductor devices according to claim 1, wherein a shade band which has a lower transmission of exposure light than a transmission of said half-tone phase-shifter pattern is formed outside a transfer region of said half-tone phase-shift mask.

12. The method for manufacturing semiconductor devices according to claim 11, wherein said attenuator film is made of metal.

13. A method for manufacturing semiconductor devices, comprising the steps of:

determining whether to use a first half-tone phase-shift mask having a half-tone phase-shifter pattern with an organic film and an attenuator film formed on a first mask substrate or a second half-tone phase-shift mask having a half-tone phase-shifter pattern of an inorganic film formed on a second mask substrate, said determination made according to the type of device structure being formed;

preparing a semiconductor substrate having a photosensitive film; and exposing the substrate using said first or said second half-tone phase-shift mask.

14. The method for manufacturing semiconductor devices according to claim 13, wherein said first half-tone phase-shift mask is used in the exposure step to form interconnects in the semiconductor devices.

15. The method for manufacturing semiconductor devices according to claim 14, wherein said exposure step to form interconnects in semiconductor devices transfers electrodes, interconnects, or holes to the substrate.

16. A multi-stage method for manufacturing semiconductor devices including a rise time of mass production stage and a mass production stage, comprising the steps of:

preparing a semiconductor substrate having a photosensitive film; and exposing the substrate using a first half-tone phase-shift mask having a half-tone phase-shifter pattern with an organic film and an attenuator film formed on a first mask substrate and a second half-tone phase-shift mask having a half-tone phase-shifter pattern of an inorganic film formed on a second mask substrate, wherein said first half-tone phase-shift mask is used at the rise time of mass production of said semiconductor devices, and the second half-tone phase-shift mask is used at the time of mass production of said semiconductor devices.

17. A method for manufacturing semiconductor devices having a master layer and a custom layer, comprising the steps of:

preparing a semiconductor substrate having a photosensitive film; and exposing the substrate using a reduction projection exposure system, wherein patterns of the custom layer are formed using a first half-tone phase-shift mask having a half-tone phase-shifter pattern with an organic film and an attenuator film formed on a first mask substrate, further wherein patterns of the master layer are formed using a photomask having a metal film as a shading body for exposure light or a half-tone phase-shift mask having a half-tone phase-shifter pattern of an inorganic film formed on a second mask substrate.

* * * * *